US010205931B2

(12) United States Patent
Thompson et al.

(10) Patent No.: US 10,205,931 B2
(45) Date of Patent: Feb. 12, 2019

(54) POWER EFFICIENT LASER DIODE DRIVER CIRCUIT AND METHOD

(71) Applicant: Microsoft Technology Licensing, LLC, Redmond, WA (US)

(72) Inventors: Barry Thompson, Menlo Park, CA (US); Stefan Wurster, Livermore, CA (US); Lawrence A. Prather, Boulder Creek, CA (US); Dane Snow, Santa Clara, CA (US); Richard McCauley, Sunnyvale, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 0 days.

(21) Appl. No.: 15/456,786

(22) Filed: Mar. 13, 2017

(65) Prior Publication Data

US 2017/0187164 A1    Jun. 29, 2017

Related U.S. Application Data

(62) Division of application No. 14/078,081, filed on Nov. 12, 2013, now Pat. No. 9,769,459.

(51) Int. Cl.
*H04N 13/254* (2018.01)
*H01S 5/065* (2006.01)
(Continued)

(52) U.S. Cl.
CPC ......... *H04N 13/254* (2018.05); *A63F 13/213* (2014.09); *H01S 5/042* (2013.01);
(Continued)

(58) Field of Classification Search
CPC .. H01S 5/042; H01S 5/06808; H01S 5/06825; H01S 5/0427; H01S 5/0651; A63F 13/213; H04N 13/0253; G06K 9/00342
See application file for complete search history.

(56) References Cited

U.S. PATENT DOCUMENTS

| 4,509,130 A | 4/1985 | Menzies et al. |
| 4,627,620 A | 12/1986 | Yang |

(Continued)

FOREIGN PATENT DOCUMENTS

| CN | 101254344 B | 6/2010 |
| EP | 0583061 A2 | 2/1994 |

(Continued)

OTHER PUBLICATIONS

Thompson, Marc T., et al., "High Power Laser Diode Driver Based on Power Converter Technology," IEEE Transactions on Power Electronics, vol. 12, No. 1, Jan. 1997, 7 pages.

(Continued)

*Primary Examiner* — Xinning(Tom) Niu
(74) *Attorney, Agent, or Firm* — Alleman Hall Creasman & Tuttle LLP

(57) ABSTRACT

A voltage mode laser diode driver selectively turns on and off a laser diode. An output stage has an output node configured to be connected to one of the terminals of the laser diode. Depending upon implementation, an active swing controller drives the output stage in a manner that substantially prevents inductive kickback from causing the output node voltage to swinging above the voltage level at the voltage output of the power supply, or swing below ground. The output stage provides a discharge path around the laser diode to shunt current associated with the inductive kickback, and substantially eliminates ringing on the output node of the output stage while the laser diode is off. A power supply controller adjusts the voltage level of the voltage output of the power supply so that current through the laser diode when on and emitting light is substantially equal to a predetermined desired current.

20 Claims, 12 Drawing Sheets

(51) Int. Cl.
*H01S 5/042* (2006.01)
*H01S 5/068* (2006.01)
*A63F 13/213* (2014.01)
*G06K 9/00* (2006.01)

(52) U.S. Cl.
CPC .......... H01S 5/0427 (2013.01); H01S 5/0651 (2013.01); H01S 5/06808 (2013.01); H01S 5/06825 (2013.01); *G06K 9/00342* (2013.01)

(56) References Cited

U.S. PATENT DOCUMENTS

| | | |
|---|---|---|
| 4,630,910 A | 12/1986 | Ross et al. |
| 4,645,458 A | 2/1987 | Williams |
| 4,647,792 A | 3/1987 | Meslener et al. |
| 4,695,953 A | 9/1987 | Blair et al. |
| 4,702,475 A | 10/1987 | Elstein et al. |
| 4,711,543 A | 12/1987 | Blair et al. |
| 4,751,642 A | 6/1988 | Silva et al. |
| 4,796,997 A | 1/1989 | Svetkoff et al. |
| 4,809,065 A | 2/1989 | Harris et al. |
| 4,817,950 A | 4/1989 | Goo |
| 4,843,568 A | 6/1989 | Krueger et al. |
| 4,893,183 A | 1/1990 | Nayar |
| 4,901,362 A | 2/1990 | Terzian |
| 4,925,189 A | 5/1990 | Braeunig |
| 5,101,444 A | 3/1992 | Wilson et al. |
| 5,148,154 A | 9/1992 | MacKay et al. |
| 5,184,295 A | 2/1993 | Mann |
| 5,229,754 A | 6/1993 | Aoki et al. |
| 5,229,756 A | 7/1993 | Kosugi et al. |
| 5,239,463 A | 8/1993 | Blair et al. |
| 5,239,464 A | 8/1993 | Blair et al. |
| 5,288,078 A | 2/1994 | Capper et al. |
| 5,295,491 A | 3/1994 | Gevins |
| 5,320,538 A | 6/1994 | Baum |
| 5,347,306 A | 9/1994 | Nitta |
| 5,385,519 A | 1/1995 | Hsu et al. |
| 5,405,152 A | 4/1995 | Katanics et al. |
| 5,417,210 A | 5/1995 | Funda et al. |
| 5,423,554 A | 6/1995 | Davis |
| 5,454,043 A | 9/1995 | Freeman |
| 5,469,740 A | 11/1995 | French et al. |
| 5,495,576 A | 2/1996 | Ritchey |
| 5,516,105 A | 5/1996 | Eisenbrey et al. |
| 5,524,637 A | 6/1996 | Erickson et al. |
| 5,534,917 A | 7/1996 | MacDougall |
| 5,563,988 A | 10/1996 | Maes et al. |
| 5,577,981 A | 11/1996 | Jarvik |
| 5,580,249 A | 12/1996 | Jacobsen et al. |
| 5,594,469 A | 1/1997 | Freeman et al. |
| 5,597,309 A | 1/1997 | Riess |
| 5,616,078 A | 4/1997 | Oh |
| 5,617,312 A | 4/1997 | Iura et al. |
| 5,638,300 A | 6/1997 | Johnson |
| 5,641,288 A | 6/1997 | Laenglein |
| 5,682,196 A | 10/1997 | Freeman |
| 5,682,229 A | 10/1997 | Wangler |
| 5,690,582 A | 11/1997 | Ulrich et al. |
| 5,703,367 A | 12/1997 | Hashimoto et al. |
| 5,704,837 A | 1/1998 | Iwasaki et al. |
| 5,715,834 A | 2/1998 | Bergamasco et al. |
| 5,748,657 A | 5/1998 | Gaddis |
| 5,875,108 A | 2/1999 | Hoffberg et al. |
| 5,877,803 A | 3/1999 | Wee et al. |
| 5,913,727 A | 6/1999 | Ahdoot |
| 5,933,125 A | 8/1999 | Fernie |
| 5,980,256 A | 11/1999 | Carmein |
| 5,989,157 A | 11/1999 | Walton |
| 5,995,649 A | 11/1999 | Marugame |
| 6,005,548 A | 12/1999 | Latypov et al. |
| 6,009,210 A | 12/1999 | Kang |
| 6,054,991 A | 4/2000 | Crane et al. |
| 6,066,075 A | 5/2000 | Poulton |
| 6,072,494 A | 6/2000 | Nguyen |
| 6,073,489 A | 6/2000 | French et al. |
| 6,077,201 A | 6/2000 | Cheng et al. |
| 6,098,458 A | 8/2000 | French et al. |
| 6,100,896 A | 8/2000 | Strohecker et al. |
| 6,101,289 A | 8/2000 | Kellner |
| 6,128,003 A | 10/2000 | Smith et al. |
| 6,130,677 A | 10/2000 | Kunz |
| 6,141,463 A | 10/2000 | Covell et al. |
| 6,147,678 A | 11/2000 | Kumar et al. |
| 6,152,856 A | 11/2000 | Studor et al. |
| 6,159,100 A | 12/2000 | Smith |
| 6,173,066 B1 | 1/2001 | Peurach et al. |
| 6,181,343 B1 | 1/2001 | Lyons |
| 6,188,777 B1 | 2/2001 | Darrell et al. |
| 6,215,890 B1 | 4/2001 | Matsuo et al. |
| 6,215,898 B1 | 4/2001 | Woodfill et al. |
| 6,226,396 B1 | 5/2001 | Marugame |
| 6,229,913 B1 | 5/2001 | Nayar et al. |
| 6,256,033 B1 | 7/2001 | Nguyen |
| 6,256,400 B1 | 7/2001 | Takata et al. |
| 6,259,714 B1 | 7/2001 | Kinbara |
| 6,283,860 B1 | 9/2001 | Lyons et al. |
| 6,289,112 B1 | 9/2001 | Jain et al. |
| 6,299,308 B1 | 10/2001 | Voronka et al. |
| 6,308,565 B1 | 10/2001 | French et al. |
| 6,316,934 B1 | 11/2001 | Amorai-Moriya et al. |
| 6,363,160 B1 | 3/2002 | Bradski et al. |
| 6,384,819 B1 | 5/2002 | Hunter |
| 6,411,744 B1 | 6/2002 | Edwards |
| 6,430,997 B1 | 8/2002 | French et al. |
| 6,476,834 B1 | 11/2002 | Doval et al. |
| 6,496,598 B1 | 12/2002 | Harman |
| 6,503,195 B1 | 1/2003 | Keller et al. |
| 6,539,931 B2 | 4/2003 | Trajkovic et al. |
| 6,570,555 B1 | 5/2003 | Prevost et al. |
| 6,633,294 B1 | 10/2003 | Rosenthal et al. |
| 6,640,202 B1 | 10/2003 | Dietz et al. |
| 6,661,918 B1 | 12/2003 | Gordon et al. |
| 6,681,031 B2 | 1/2004 | Cohen et al. |
| 6,714,665 B1 | 3/2004 | Hanna et al. |
| 6,731,799 B1 | 5/2004 | Sun et al. |
| 6,738,066 B1 | 5/2004 | Nguyen |
| 6,765,726 B2 | 7/2004 | French et al. |
| 6,788,809 B1 | 9/2004 | Grzeszczuk et al. |
| 6,801,637 B2 | 10/2004 | Voronka et al. |
| 6,873,723 B1 | 3/2005 | Aucsmith et al. |
| 6,876,496 B2 | 4/2005 | French et al. |
| 6,937,742 B2 | 8/2005 | Roberts et al. |
| 6,950,534 B2 | 9/2005 | Cohen et al. |
| 7,003,134 B1 | 2/2006 | Covell et al. |
| 7,036,094 B1 | 4/2006 | Cohen et al. |
| 7,038,855 B2 | 5/2006 | French et al. |
| 7,039,676 B1 | 5/2006 | Day et al. |
| 7,042,440 B2 | 5/2006 | Pryor et al. |
| 7,050,606 B2 | 5/2006 | Paul et al. |
| 7,058,204 B2 | 6/2006 | Hildreth et al. |
| 7,060,957 B2 | 6/2006 | Lange et al. |
| 7,113,918 B1 | 9/2006 | Ahmad et al. |
| 7,121,946 B2 | 10/2006 | Paul et al. |
| 7,170,492 B2 | 1/2007 | Bell |
| 7,184,048 B2 | 2/2007 | Hunter |
| 7,202,898 B1 | 4/2007 | Braun et al. |
| 7,222,078 B2 | 5/2007 | Abelow |
| 7,227,526 B2 | 6/2007 | Hildreth et al. |
| 7,259,747 B2 | 8/2007 | Bell |
| 7,308,112 B2 | 12/2007 | Fujimura et al. |
| 7,317,836 B2 | 1/2008 | Fujimura et al. |
| 7,348,963 B2 | 3/2008 | Bell |
| 7,359,121 B2 | 4/2008 | French et al. |
| 7,367,887 B2 | 5/2008 | Watabe et al. |
| 7,379,563 B2 | 5/2008 | Shamaie |
| 7,379,566 B2 | 5/2008 | Hildreth |
| 7,389,591 B2 | 6/2008 | Jaiswal et al. |
| 7,412,077 B2 | 8/2008 | Li et al. |
| 7,421,093 B2 | 9/2008 | Hildreth et al. |
| 7,430,312 B2 | 9/2008 | Gu |
| 7,436,496 B2 | 10/2008 | Kawahito |
| 7,450,736 B2 | 11/2008 | Yang et al. |
| 7,452,275 B2 | 11/2008 | Kuraishi |

(56) References Cited

U.S. PATENT DOCUMENTS

| | | |
|---|---|---|
| 7,460,690 B2 | 12/2008 | Cohen et al. |
| 7,489,812 B2 | 2/2009 | Fox et al. |
| 7,536,032 B2 | 5/2009 | Bell |
| 7,555,142 B2 | 6/2009 | Hildreth et al. |
| 7,560,701 B2 | 7/2009 | Oggier et al. |
| 7,570,805 B2 | 8/2009 | Gu |
| 7,574,020 B2 | 8/2009 | Shamaie |
| 7,576,727 B2 | 8/2009 | Bell |
| 7,590,262 B2 | 9/2009 | Fujimura et al. |
| 7,593,552 B2 | 9/2009 | Higaki et al. |
| 7,598,942 B2 | 10/2009 | Underkoffler et al. |
| 7,607,509 B2 | 10/2009 | Schmiz et al. |
| 7,620,202 B2 | 11/2009 | Fujimura et al. |
| 7,668,340 B2 | 2/2010 | Cohen et al. |
| 7,680,298 B2 | 3/2010 | Roberts et al. |
| 7,683,954 B2 | 3/2010 | Ichikawa et al. |
| 7,684,592 B2 | 3/2010 | Paul et al. |
| 7,701,439 B2 | 4/2010 | Hillis et al. |
| 7,702,130 B2 | 4/2010 | Im et al. |
| 7,704,135 B2 | 4/2010 | Harrison, Jr. |
| 7,710,391 B2 | 5/2010 | Bell et al. |
| 7,729,530 B2 | 6/2010 | Antonov et al. |
| 7,746,345 B2 | 6/2010 | Hunter |
| 7,760,182 B2 | 7/2010 | Ahmad et al. |
| 7,809,167 B2 | 10/2010 | Bell |
| 7,834,846 B1 | 11/2010 | Bell |
| 7,852,262 B2 | 12/2010 | Namineni et al. |
| RE42,256 E | 3/2011 | Edwards |
| 7,898,522 B2 | 3/2011 | Hildreth et al. |
| 8,035,612 B2 | 10/2011 | Bell et al. |
| 8,035,614 B2 | 10/2011 | Bell et al. |
| 8,035,624 B2 | 10/2011 | Bell et al. |
| 8,072,470 B2 | 12/2011 | Marks |
| 2002/0071468 A1* | 6/2002 | Sandstrom .......... G03F 7/70025 372/57 |
| 2003/0016711 A1* | 1/2003 | Crawford ................ H01S 5/042 372/38.02 |
| 2006/0132183 A1* | 6/2006 | Lim ................. H03K 19/00323 326/83 |
| 2008/0026838 A1 | 1/2008 | Dunstan et al. |
| 2011/0085576 A1 | 4/2011 | Crawford et al. |
| 2011/0205522 A1 | 8/2011 | Snow |
| 2012/0017153 A1 | 1/2012 | Matsuda et al. |
| 2012/0056982 A1* | 3/2012 | Katz .................... H04N 13/025 348/43 |
| 2013/0049628 A1 | 2/2013 | Kwong |
| 2015/0130903 A1 | 5/2015 | Thompson et al. |

FOREIGN PATENT DOCUMENTS

| | | |
|---|---|---|
| GB | 2002191 A | 2/1979 |
| JP | H03-151679 A | 6/1991 |
| JP | 08044490 A1 | 2/1996 |
| TW | 201316822 A | 4/2013 |
| WO | 93/10708 A1 | 6/1993 |
| WO | 97/17598 A1 | 5/1997 |
| WO | 99/44698 A1 | 9/1999 |

OTHER PUBLICATIONS

Koechner, Walter, "Solid State Laser Engineering," Springer Series in Optical Sciences, retrieved on May 29, 2013, [http://icole.mut.ac.ir/downloads/SC/W06/Solid%20State%20Laser%20Engineering.pdf], 765 pages.

Tan, Tun S., et al., "Flip-Chip Photodetector for High-Speed Communications Instrumentation," The Hewlett-Packard Journal, Dec. 1997, 10 pages.

Gao, Shubo, "New technologies for lead-free flip chip assembly," Department of Electrical and Electronic Engineering, Imperial College London, retrieved May 29, 2013, [http://www3.imperial.ac.uk/pls/portallive/docs/1/5067986.PDF], 137 pages.

MOSFETs in ICs⇒Scaling, Leakage and Other Topics, [Hu_cho7v3.fm], Feb. 13, 2009, 32 pages.

International Search Report and Written Opinion dated dated May 11, 2015, in PCT Application No. PCT/US2014/063617 filed Nov. 3, 2014, 19 Pages.

Amendment dated Aug. 21, 2015, in PCT Application No. PCT/US2014/063617 filed Nov. 3, 2014, 19 Pages.

Written Opinion dated Nov. 16, 2015, in PCT Application No. PCT/US2014/063617 filed Nov. 3, 2014.

Response to Written Opinion filed Jan. 15, 2016, in PCT Application No. PCT/US2014/063617 filed Nov. 3, 2014.

International Preliminary Report on Patentability Issued in PCT Application No. PCT/US2014/063617 dated Feb. 5, 2016.

Preliminary Amendment filed Nov. 19, 2015 in U.S. Appl. No. 14/078,081, filed Nov. 12, 2013.

Restriction dated Apr. 8, 2016 in U.S. Appl. No. 14/078,081, filed Nov. 12, 2013.

Response to Restriction filed Apr. 14, 2016 in U.S. Appl. No. 14/078,081, filed Nov. 12, 2013.

Office Action dated May 12, 2016 in U.S. Appl. No. 14/078,081, filed Nov. 12, 2013.

Response to Office Action filed Jun. 8, 2016 in U.S. Appl. No. 14/078,081, filed Nov. 12, 2013.

Office Action dated Sep. 23, 2016 in U.S. Appl. No. 14/078,081, filed Nov. 12, 2013.

Response to Office Action filed Nov. 9, 2016 in U.S. Appl. No. 14/078,081, filed Nov. 12, 2013.

Notice of Allowance dated Dec. 13, 2016 in U.S. Appl. No. 14/078,081 filed Nov. 12, 2013.

Kanade et al., "A Stereo Machine for Video-rate Dense Depth Mapping and Its New Applications", IEEE Computer Society Conference on Computer Vision and Pattern Recognition, 1996, pp. 196-202,The Robotics Institute, Carnegie Mellon University, Pittsburgh, PA.

Miyagawa et al., "CCD-Based Range Finding Sensor", Oct. 1997, pp. 1648-1652, vol. 44 No. 10, IEEE Transactions on Electron Devices.

Rosenhahn et al., "Automatic Human Model Generation", 2005, pp. 41-48, University of Auckland (CITR), New Zealand.

Aggarwal et al., "Human Motion Analysis: A Review", IEEE Nonrigid and Articulated Motion Workshop, 1997, University of Texas at Austin, Austin, TX.

Shao et al., "An Open System Architecture for a Multimedia and Multimodal User Interface", Aug. 24, 1998, Japanese Society for Rehabilitation of Persons with Disabilities (JSRPD), Japan.

Kohler, "Special Topics of Gesture Recognition Applied in Intelligent Home Environments", In Proceedings of the Gesture Workshop, 1998, pp. 285-296, Germany.

Kohler, "Vision Based Remote Control in Intelligent Home Environments", University of Erlangen-Nuremberg/Germany, 1996, pp. 147-154, Germany.

Kohler, "Technical Details and Ergonomical Aspects of Gesture Recognition applied in Intelligent Home Environments", 1997, Germany.

Hasegawa et al., "Human-Scale Haptic Interaction with a Reactive Virtual Human in a Real-Time Physics Simulator", Jul. 2006, vol. 4, No. 3, Article 6C, ACM Computers in Entertainment, New York, NY.

Qian et al., "A Gesture-Driven Multimodal Interactive Dance System", Jun. 2004, pp. 1579-1582, IEEE International Conference on Multimedia and Expo (ICME), Taipei, Taiwan.

Zhao, "Dressed Human Modeling, Detection, and Parts Localization", 2001, The Robotics Institute, Carnegie Mellon University, Pittsburgh, PA.

He, "Generation of Human Body Models", Apr. 2005, University of Auckland, New Zealand.

Isard et al., "CONDENSATION—Conditional Density Propagation for Visual Tracking", 1998, pp. 5-28, International Journal of Computer Vision 29(1), Netherlands.

Livingston, "Vision-based Tracking with Dynamic Structured Light for Video See-through Augmented Reality", 1998, University of North Carolina at Chapel Hill, North Carolina, USA.

Wren et al., "Pfinder: Real-Time Tracking of the Human Body", MIT Media Laboratory Perceptual Computing Section Technical

(56) References Cited

OTHER PUBLICATIONS

Report No. 353, Jul. 1997, vol. 19, No. 7, pp. 780-785, IEEE Transactions on Pattern Analysis and Machine Intelligence, Caimbridge, MA.

Breen et al., "Interactive Occlusion and Collision of Real and Virtual Objects in Augmented Reality", Technical Report ECRC-95-02, 1995, European Computer-Industry Research Center GmbH, Munich, Germany.

Freeman et al., "Television Control by Hand Gestures", Dec. 1994, Mitsubishi Electric Research Laboratories, TR94-24, Caimbridge, MA.

Hongo et al., "Focus of Attention for Face and Hand Gesture Recognition Using Multiple Cameras", Mar. 2000, pp. 156-161, 4th IEEE International Conference on Automatic Face and Gesture Recognition, Grenoble, France.

Pavlovic et al., "Visual Interpretation of Hand Gestures for Human-Computer Interaction: A Review", Jul. 1997, pp. 677-695, vol. 19, No. 7, IEEE Transactions on Pattern Analysis and Machine Intelligence.

Azarbayejani et al., "Visually Controlled Graphics", Jun. 1993, vol. 15, No. 6, IEEE Transactions on Pattern Analysis and Machine Intelligence.

Granieri et al., "Simulating Humans in VR", The British Computer Society, Oct. 1994, Academic Press.

Brogan et al., "Dynamically Simulated Characters in Virtual Environments", Sep./Oct. 1998, pp. 2-13, vol. 18, Issue 5, IEEE Computer Graphics and Applications.

Fisher et al., "Virtual Environment Display System", ACM Workshop on Interactive 3D Graphics, Oct. 1986, Chapel Hill, NC.

"Virtual High Anxiety", Tech Update, Aug. 1995, pp. 22.

Sheridan et al., "Virtual Reality Check", Technology Review, Oct. 1993, pp. 22-28, vol. 96, No. 7.

Stevens, "Flights into Virtual Reality Treating Real World Disorders", The Washington Post, Mar. 27, 1995, Science Psychology, 2 pages.

"Simulation and Training", 1994, Division Incorporated.

English Machine-translation of Japanese Publication No. JP08-044490 published on Feb. 16, 1996.

"Office Action and Search Report Issued in Taiwan Patent Application No. 103134437", dated Mar. 15, 2018, 12 Pages.

\* cited by examiner

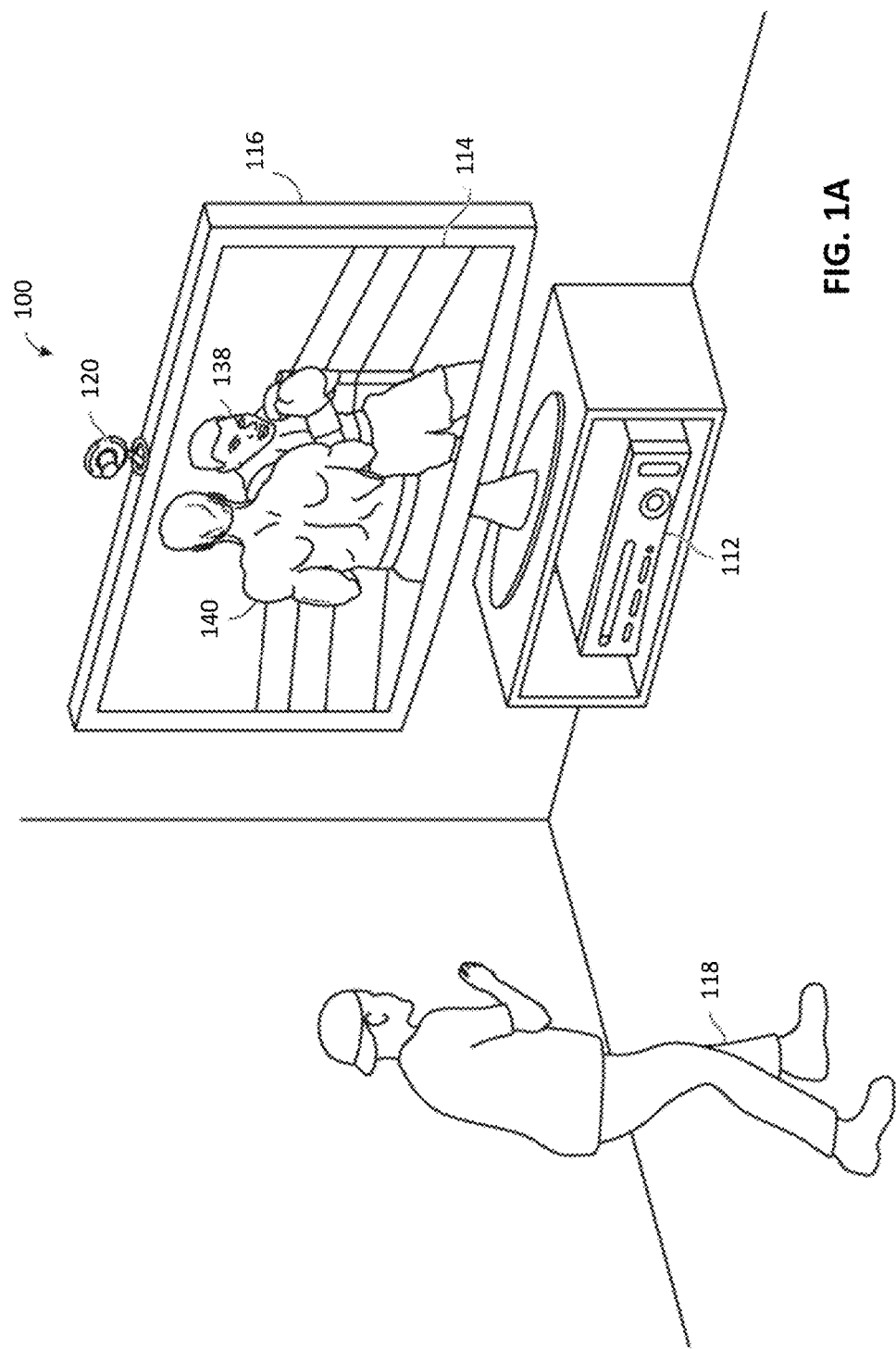

FIG. 6

POWER EFFICIENT LASER DIODE DRIVER CIRCUIT AND METHOD

CLAIM OF PRIORITY

This application is a divisional application of U.S. patent application Ser. No. 14/078,081, entitled "POWER EFFICIENT LASER DIODE DRIVER CIRCUIT AND METHOD," filed Nov. 12, 2013, which is incorporated herein by reference.

BACKGROUND

Depth cameras often illuminate a scene with modulated laser light. Measured depth precision improves with increased modulation frequency, increased light power, and increased modulation depth. In many cases, scene illumination consumes a substantial portion of an overall depth camera power budget. Accordingly, it can be appreciated that an efficient, high frequency, high power laser diode driver circuit is a key component in a depth camera.

High power solid state laser diodes emit light power proportional to their junction current. For a high power edge emitting infrared laser diode, a voltage of close to 2V is required. For a laser diode including high powered vertical-cavity surface-emitting lasers (VCSELs) the forward voltage can be as high as 2.8V.

Exemplary prior art current mode laser diode drivers are shown in FIGS. 10 and 11, with FIG. 10 illustrating a single-ended configuration laser diode driver 1004, and FIG. 11 illustrating a differential configuration laser diode driver circuit 1104. The laser diode drivers of FIGS. 10 and 11 both control laser diode power by adjusting a current source Ictl. In FIG. 10, a single-ended voltage modulation signal Vmod modulates the laser diode LD by controlling a switching transistor Msw to switch the current flowing from the laser diode to the current source Ictl. In FIG. 11, differential voltage modulation signals, Vmod and Vmod_bar, modulate the laser diode LD by controlling differential switching transistors Msw1 and Msw2 so that current flow in the current source Ictl is switched at the laser diode LD but is continuous at the current source Ictl or single-ended so that the current source current Ictl is switched along with the current to the laser diode LD. The single-ended approach of FIG. 10 is more power efficient, but is more difficult to implement at high switching frequencies than the differential approach of FIG. 11.

An advantage of the prior art current mode laser diode drivers 1004 and 1104 of FIGS. 10 and 11 is that laser diode power is easily controlled by adjusting the current in the current source Ictl. Also, high switching speed is readily obtainable in the differential configuration of FIG. 11.

A disadvantage of the prior art current mode laser diode drivers 1004 and 1104 of FIGS. 10 and 11 is that they have poor power efficiency because only a small part of the power supply voltage drop is across the laser diode LD. For instance, if a power supply of 5V is used and a laser voltage of 2V is assumed, the resulting efficiency is only about 40 percent. Power efficiency is further reduced by voltage drop across the transistor switches, Msw in FIG. 10, and Msw1 and Msw2 in FIG. 11. Another significant shortcoming of the prior art current mode laser diode drivers 1004 and 1104 is that it is difficult to create an accurate current reference and current mirroring setup. The resulting current is often modulated by the current drawn by the laser diode LD and these current fluctuations can cause positive feedbacks resulting in severe peaking, which is undesirable.

Laser diode drivers, such as but not limited to those of FIGS. 10 and 11, encounter the problem of inductive kickback. When the current in the laser diode is switched off, inductance in the laser diode package and the driver package fights the turnoff and boosts the cathode voltage Vk of the laser diode LD. Left uncorrected, this voltage kickback will boost the cathode voltage Vk well above the power supply voltage Vdd, which can potentially damage circuitry of the laser diode driver.

A typical solution to this problem is to add an external clamping diode, Dclamp, as shown in FIGS. 10 and 11. If this clamp diode is sufficiently fast and has sufficient current carrying capacity, the voltage at Vk will only rise a little above the power supply voltage VL and the driver chip will be spared most of the damage. However, in practice, it is difficult to find diodes with sufficient speed and current capacity for high-speed and high-power applications, such as these. Moreover, the clamp diode and board parasitic inductances should be minimized for this solution to be effective. However, since these clamping diodes normally are on a printed circuit board they have to contend with the package and board inductance, which renders them to a great extent less effective.

Another problem encountered in laser diode driver circuits for depth cameras is variation in the latency through the driver circuits over process, temperature, and voltage. Uncompensated latency changes will result in significant errors in measured depths. For example, in one configuration, a change in latency of 6 ps can produce a measurement error of ~1 mm. A high-power driver in a standard configuration will require a large number of buffers to boost the drive current to the desired level. Such buffers will have insertion delay and this delay will vary by much more than 6 ps over process, temperature, and voltage.

The main disadvantages of the prior art current mode laser diode driver circuits of FIGS. 10 and 11 are the large required die area, poor high frequency operation in the single-end configuration of FIG. 10, and poor power efficiency.

SUMMARY

Disclosed herein are power efficient laser diode drivers, depth camera systems that include such laser diode drivers, and methods for driving laser diodes. In accordance with an embodiment, a laser diode driver is a voltage mode laser diode driver that selectively turns on and off a laser diode. The voltage mode laser diode driver includes an output stage and an active swing controller. The output stage includes an output node configured to be connected to one of the terminals of the laser diode (i.e., the anode terminal or the cathode terminal of the laser diode). The active swing controller is configured to drive the output stage in dependence on a modulation signal.

In accordance with an embodiment, the anode of the laser diode is connected to the voltage output of the power supply and the cathode of the laser diode is connected to the output node of the output stage. In such an embodiment, the output stage, under control of the active swing controller, selectively pulls a voltage level of the output node of the output stage down towards ground, in response to which the laser diode is turned on and emits light. Additionally, the output stage, under control of the active swing controller, selectively pulls the output node of the output stage up towards the voltage level of the voltage output of the power supply, in response to which the laser diode is turned off and does not emit light. Advantageously, the active swing controller drives the output stage in a manner that substantially prevents inductive kickback, which occurs in response to the laser diode being turned from on to off, from boosting the voltage level at the output node of the output stage above the voltage level at the voltage output of the power supply. In accordance with an embodiment, the active swing controller provides a discharge path around the laser diode to shunt a current associated with the inductive kickback that occurs in response to the laser diode being turned from on to off. Additionally, the output stage provides impedance matching that substantially eliminates ringing on the cathode of the laser diode, and more generally the output node of the output stage, while the laser diode is off.

In accordance with an alternative embodiment, the anode of the laser diode is connected to the output node of the output stage and the cathode of the laser diode is connected to ground. In such an embodiment, the output stage, under control of the active swing controller, selectively pulls a voltage level of the output node of the output stage up towards the voltage level at the voltage output of the power supply, in response to which the laser diode is turned on and emits light. Additionally, the output stage, under control of the active swing controller, selectively pulls the output node of the output stage down towards ground, in response to which the laser diode is turned off and does not emit light. Advantageously, the active swing controller drives the output stage in a manner that substantially prevents inductive kickback, which occurs in response to the laser diode being turned from on to off, from pulling the voltage level at the output node of the output stage (and thus, at the anode of the laser diode) below ground. In accordance with an embodiment, the active swing controller provides a discharge path around the laser diode to shunt a current associated with the inductive kickback that occurs in response to the laser diode being turned from on to off. Additionally, the output stage provides impedance matching that substantially eliminates ringing on the anode of the laser diode, and more generally the output node of the output stage, while the laser diode is off.

In accordance with an embodiment, to increase and preferably substantially maximize power efficiency, the voltage mode laser diode driver also includes a power supply controller that adjusts the voltage level of the voltage output of the power supply so that the current that flows through the laser diode when the laser diode is turned on and emitting light is substantially equal to a predetermined desired current. More specifically, the power supply controller can produce a feedback signal that is provided to the power supply in order to adjust the voltage level of the voltage output of the power supply in dependence a drain-to-source voltage of a transistor of the output stage while the laser diode is turned on, wherein the drain-to-source voltage of the transistor of the output stage is indicative of an actual laser diode current while the laser diode is on and emitting light. In a specific embodiment, the feedback signal is produced in dependence on a difference between the drain-to-source voltage of the transistor of the output stage (which is indicative of an actual laser diode current while the laser diode is on and emitting light) and a reference drain-to-source voltage of a reference transistor (which is indicative of a desired laser diode current). Such a desired laser diode current can, for example, be used to achieve a minimum laser power that can be used to obtain depth images having a desired resolution.

In accordance with an embodiment, a depth camera system includes the aforementioned power supply, laser diode and voltage mode laser diode driver, as well as an image pixel detector that detects light originating from the laser diode that has reflected off an object and is incident of the image pixel detector array. Additionally, the depth camera system includes one or more processors that produce depth images in dependence on outputs of the image pixel detector and update an application based on the depth images.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter. Furthermore, the claimed subject matter is not limited to implementations that solve any or all disadvantages noted in any part of this disclosure.

BRIEF DESCRIPTION OF THE DRAWINGS

FIGS. 1A and 1B illustrate an example embodiment of a tracking system with a user playing a game.

FIG. 6 depicts exemplary data in an exemplary depth image.

DETAILED DESCRIPTION

Certain embodiments of the present technology disclosed herein are related to laser diode drivers for use with depth cameras, methods for driving laser diodes, and systems that include a depth camera, which can be referred to as depth camera systems. Before providing additional details of such embodiments of the present technology, exemplary details of larger systems with which embodiments of the present technology can be used will first be described.

Figure 1B:
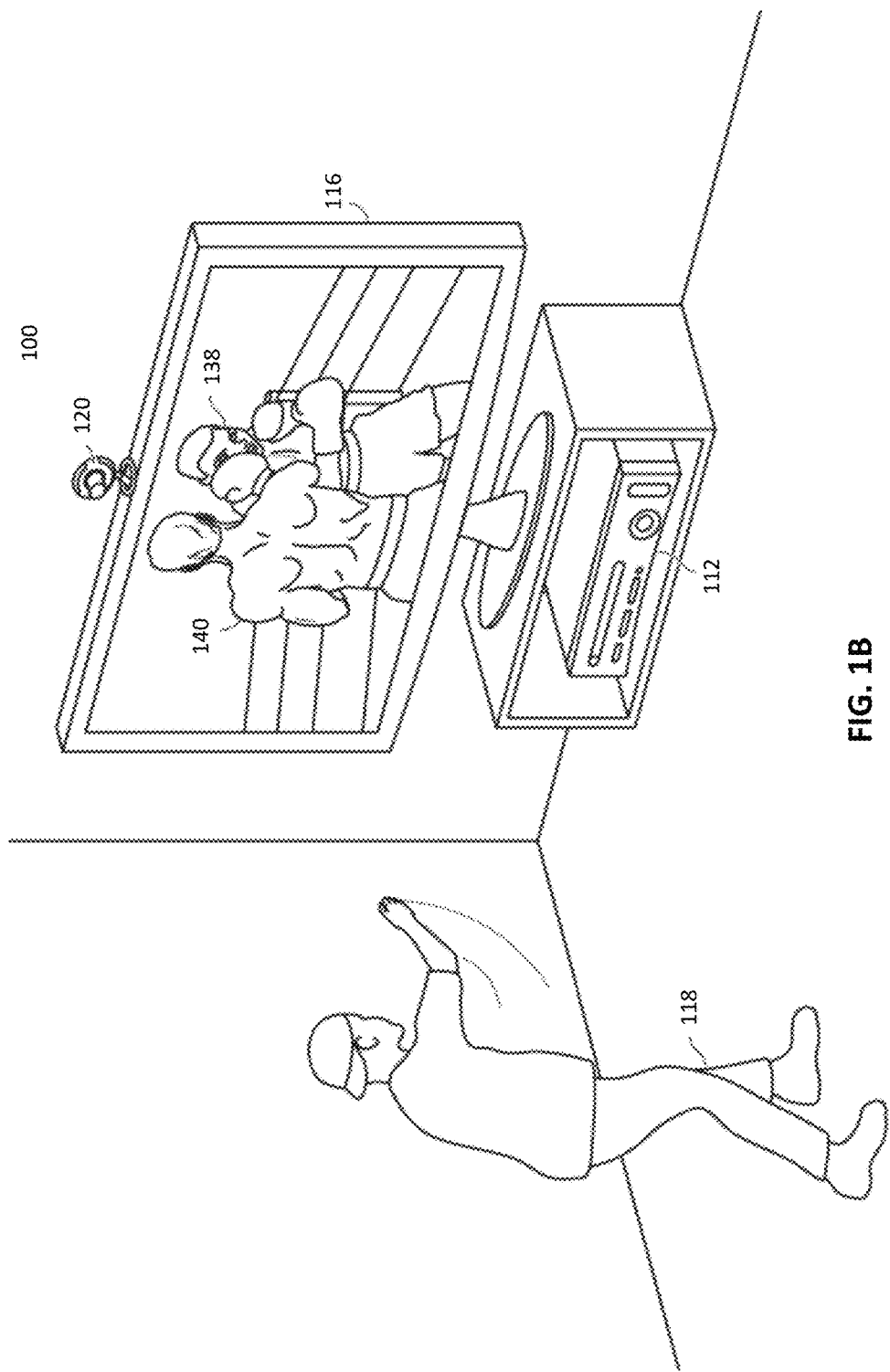

FIGS. 1A and 1B illustrate an example embodiment of a tracking system 100 with a user 118 playing a boxing video game. In an example embodiment, the tracking system 100 may be used to recognize, analyze, and/or track a human target such as the user 118 or other objects within range of the tracking system 100. As shown in FIG. 1A, the tracking system 100 includes a computing system 112 and a capture device 120. As will be describe in additional detail below, the capture device 120 can be used to obtain depth images and color images (also known as RGB images) that can be used by the computing system 112 to identify one or more users or other objects, as well as to track motion and/or other user behaviors. The tracked motion and/or other user behavior can be used to update an application. Therefore, a user can manipulate game characters or other aspects of the application by using movement of the user's body and/or objects around the user, rather than (or in addition to) using controllers, remotes, keyboards, mice, or the like. For example, a video game system can update the position of images displayed in a video game based on the new positions of the objects or update an avatar based on motion of the user.

The computing system 112 may be a computer, a gaming system or console, or the like. According to an example embodiment, the computing system 112 may include hardware components and/or software components such that computing system 112 may be used to execute applications such as gaming applications, non-gaming applications, or the like. In one embodiment, computing system 112 may include a processor such as a standardized processor, a specialized processor, a microprocessor, or the like that may execute instructions stored on a processor readable storage device for performing the processes described herein.

The capture device 120 may include, for example, a camera that may be used to visually monitor one or more users, such as the user 118, such that gestures and/or movements performed by the one or more users may be captured, analyzed, and tracked to perform one or more controls or actions within the application and/or animate an avatar or on-screen character, as will be described in more detail below.

According to one embodiment, the tracking system 100 may be connected to an audiovisual device 116 such as a television, a monitor, a high-definition television (HDTV), or the like that may provide game or application visuals and/or audio to a user such as the user 118. For example, the computing system 112 may include a video adapter such as a graphics card and/or an audio adapter such as a sound card that may provide audiovisual signals associated with the game application, non-game application, or the like. The audiovisual device 116 may receive the audiovisual signals from the computing system 112 and may then output the game or application visuals and/or audio associated with the audiovisual signals to the user 118. According to one embodiment, the audiovisual device 16 may be connected to the computing system 112 via, for example, an S-Video cable, a coaxial cable, an HDMI cable, a DVI cable, a VGA cable, component video cable, but are not limited thereto.

As shown in FIGS. 1A and 1B, the tracking system 100 may be used to recognize, analyze, and/or track a human target such as the user 118. For example, the user 118 may be tracked using the capture device 120 such that the gestures and/or movements of user 118 may be captured to animate an avatar or on-screen character and/or may be interpreted as controls that may be used to affect the application being executed by computing system 112. Thus, according to one embodiment, the user 118 may move his or her body to control the application and/or animate the avatar or on-screen character.

In the example depicted in FIGS. 1A and 1B, the application executing on the computing system 112 may be a boxing game that the user 118 is playing. For example, the computing system 112 may use the audiovisual device 116 to provide a visual representation of a boxing opponent 138 to the user 118. The computing system 112 may also use the audiovisual device 116 to provide a visual representation of a player avatar 140 that the user 118 may control with his or her movements. For example, as shown in FIG. 1B, the user 118 may throw a punch in physical space to cause the player avatar 140 to throw a punch in game space. Thus, according to an example embodiment, the computer system 112 and the capture device 120 recognize and analyze the punch of the user 118 in physical space such that the punch may be interpreted as a game control of the player avatar 140 in game space and/or the motion of the punch may be used to animate the player avatar 140 in game space.

Other movements by the user 118 may also be interpreted as other controls or actions and/or used to animate the player avatar, such as controls to bob, weave, shuffle, block, jab, or throw a variety of different power punches. Furthermore, some movements may be interpreted as controls that may correspond to actions other than controlling the player avatar 140. For example, in one embodiment, the player may use movements to end, pause, or save a game, select a level, view high scores, communicate with a friend, etc. According to another embodiment, the player may use movements to select the game or other application from a main user interface. Thus, in example embodiments, a full range of motion of the user 118 may be available, used, and analyzed in any suitable manner to interact with an application.

In example embodiments, the human target such as the user 118 may have an object. In such embodiments, the user of an electronic game may be holding the object such that the motions of the player and the object may be used to adjust and/or control parameters of the game. For example, the motion of a player holding a racket may be tracked and utilized for controlling an on-screen racket in an electronic sports game. In another example embodiment, the motion of a player holding an object may be tracked and utilized for controlling an on-screen weapon in an electronic combat game. Objects not held by the user can also be tracked, such as objects thrown, pushed or rolled by the user (or a different user) as well as self-propelled objects. In addition to boxing, other games can also be implemented.

According to other example embodiments, the tracking system 100 may further be used to interpret target movements as operating system and/or application controls that are outside the realm of games. For example, virtually any controllable aspect of an operating system and/or application may be controlled by movements of the target such as the user 118.

Figure 2A:
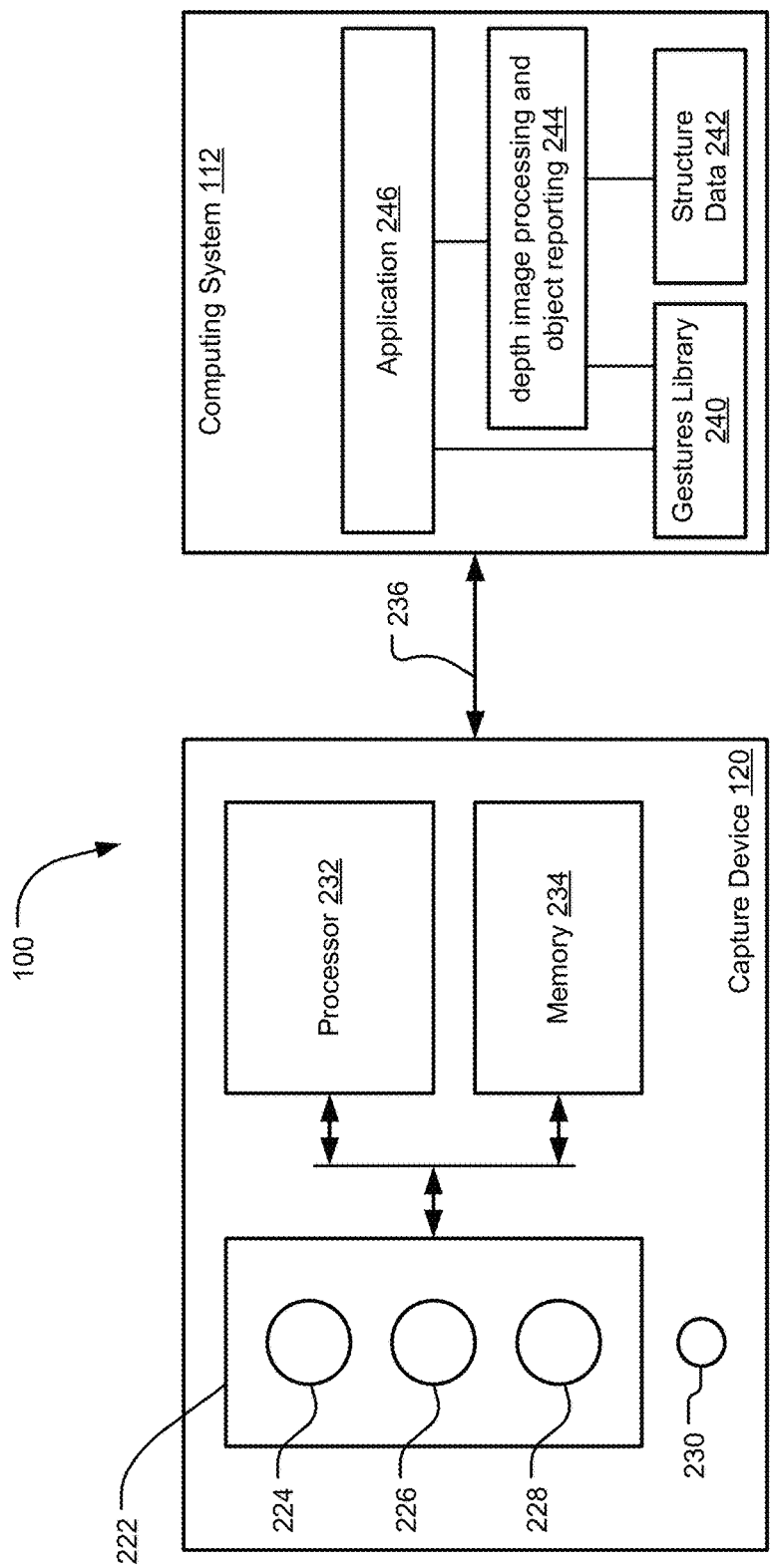
FIG. 2A illustrates an example embodiment of a capture device that may be used as part of the tracking system.

FIG. 2A illustrates an example embodiment of the capture device 120 that may be used in the tracking system 100. According to an example embodiment, the capture device 120 may be configured to capture video with depth information including a depth image that may include depth values via any suitable technique including, for example, time-of-flight, structured light, stereo image, or the like. According to one embodiment, the capture device 120 may organize the depth information into "Z layers," or layers that may be perpendicular to a Z axis extending from the depth camera along its line of sight.

As shown in FIG. 2A, the capture device 120 may include an image camera component 222. According to an example embodiment, the image camera component 222 may be a depth camera that may capture a depth image of a scene. The depth image may include a two-dimensional (2-D) or three-dimensional (3-D) pixel area of the captured scene where each pixel in the 2-D or 3-D pixel area may represent a depth value such as a distance in, for example, centimeters, millimeters, or the like of an object in the captured scene from the camera.

As shown in FIG. 2A, according to an example embodiment, the image camera component 222 may include an infra-red (IR) light component 224, a three-dimensional (3-D) camera 226, and an RGB camera 228 that may be used to capture the depth image of a scene. For example, in time-of-flight (TOF) analysis, the IR light component 224 of the capture device 120 may emit an infrared light onto the scene and may then use sensors (not specifically shown in FIG. 2A) to detect the backscattered light from the surface of one or more targets and objects in the scene using, for example, the 3-D camera 226 and/or the RGB camera 228. In some embodiments, pulsed IR light may be used such that the time between an outgoing light pulse and a corresponding incoming light pulse may be measured and used to determine a physical distance from the capture device 120 to a particular location on the targets or objects in the scene. Additionally or alternatively, the phase of the outgoing light wave may be compared to the phase of the incoming light wave to determine a phase shift. The phase shift may then be used to determine a physical distance from the capture device to a particular location on the targets or objects. Additional details of an exemplary TOF type of 3-D camera 226, which can also be referred to as a depth camera, are described below with reference to FIG. 2B.

According to another example embodiment, TOF analysis may be used to indirectly determine a physical distance from the capture device 120 to a particular location on the targets or objects by analyzing the intensity of the reflected beam of light over time via various techniques including, for example, shuttered light pulse imaging.

In another example embodiment, the capture device 120 may use a structured light to capture depth information. In such an analysis, patterned light (i.e., light displayed as a known pattern such as grid pattern, a stripe pattern, or different pattern) may be projected onto the scene via, for example, the IR light component 224. Upon striking the surface of one or more targets or objects in the scene, the pattern may become deformed in response. Such a deformation of the pattern may be captured by, for example, the 3-D camera 226 and/or the RGB camera 228 and may then be analyzed to determine a physical distance from the capture device to a particular location on the targets or objects. In some implementations, the IR Light component 224 is displaced from the cameras 226 and 228 so triangulation can be used to determined distance from cameras 226 and 228. In some implementations, the capture device 120 will include a dedicated IR sensor to sense the IR light.

According to another embodiment, the capture device 120 may include two or more physically separated cameras that may view a scene from different angles to obtain visual stereo data that may be resolved to generate depth information. Other types of depth image sensors can also be used to create a depth image.

The capture device 120 may further include a microphone 230, or an array of microphones 230. Each microphone 230 may include a transducer or sensor that may receive and convert sound into an electrical signal. According to one embodiment, the microphone(s) 230 may be used to reduce feedback between the capture device 120 and the computing system 112 in the target recognition, analysis, and tracking system 100. Additionally, the microphone(s) 230 may be used to receive audio signals (e.g., voice commands) that may also be provided by the user to control applications such as game applications, non-game applications, or the like that may be executed by the computing system 112.

In an example embodiment, the capture device 120 may further include a processor 232 that may be in operative communication with the image camera component 222. The processor 232 may include a standardized processor, a specialized processor, a microprocessor, or the like that may execute instructions including, for example, instructions for receiving a depth image, generating the appropriate data format (e.g., frame) and transmitting the data to computing system 112.

The capture device 120 may further include a memory component 234 that may store the instructions that may be executed by the processor 232, images or frames of images captured by the 3-D camera and/or RGB camera, or any other suitable information, images, or the like. According to an example embodiment, the memory component 234 may include random access memory (RAM), read only memory (ROM), cache, Flash memory, a hard disk, or any other suitable storage component. As shown in FIG. 2A, in one embodiment, the memory component 234 may be a separate component in communication with the image capture component 222 and the processor 232. According to another embodiment, the memory component 234 may be integrated into the processor 232 and/or the image capture component 222.

As shown in FIG. 2A, the capture device 120 may be in communication with the computing system 212 via a communication link 236. The communication link 236 may be a wired connection including, for example, a USB connection, a Firewire connection, an Ethernet cable connection, or the like and/or a wireless connection such as a wireless 802.11b, g, a, or n connection. According to one embodiment, the computing system 112 may provide a clock to the capture device 120 that may be used to determine when to capture, for example, a scene via the communication link 236. Additionally, the capture device 120 provides the depth images and color images captured by, for example, the 3-D camera 226 and/or the RGB camera 228 to the computing system 112 via the communication link 236. In one embodiment, the depth images and color images are transmitted at 30 frames per second. The computing system 112 may then use the model, depth information, and captured images to, for example, control an application such as a game or word processor and/or animate an avatar or on-screen character.

Computing system 112 includes gestures library 240, structure data 242, depth image processing and object reporting module 244 and application 246. Depth image processing and object reporting module 244 uses the depth images to track motion of objects, such as the user and other objects. To assist in the tracking of the objects, depth image processing and object reporting module 244 uses gestures library 240 and structure data 242.

Structure data 242 includes structural information about objects that may be tracked. For example, a skeletal model of a human may be stored to help understand movements of the user and recognize body parts. Structural information about inanimate objects may also be stored to help recognize those objects and help understand movement.

Gestures library 240 may include a collection of gesture filters, each comprising information concerning a gesture that may be performed by the skeletal model (as the user moves). The data captured by the cameras 226, 228 and the capture device 120 in the form of the skeletal model and movements associated with it may be compared to the gesture filters in the gesture library 240 to identify when a user (as represented by the skeletal model) has performed one or more gestures. Those gestures may be associated with various controls of an application. Thus, the computing system 112 may use the gestures library 240 to interpret movements of the skeletal model and to control application 246 based on the movements. As such, gestures library may be used by depth image processing and object reporting module 244 and application 246.

Application 246 can be a video game, productivity application, etc. In one embodiment, depth image processing and object reporting module 244 will report to application 246 an identification of each object detected and the location of the object for each frame. Application 246 will use that information to update the position or movement of an avatar or other images in the display.

Figure 2B:
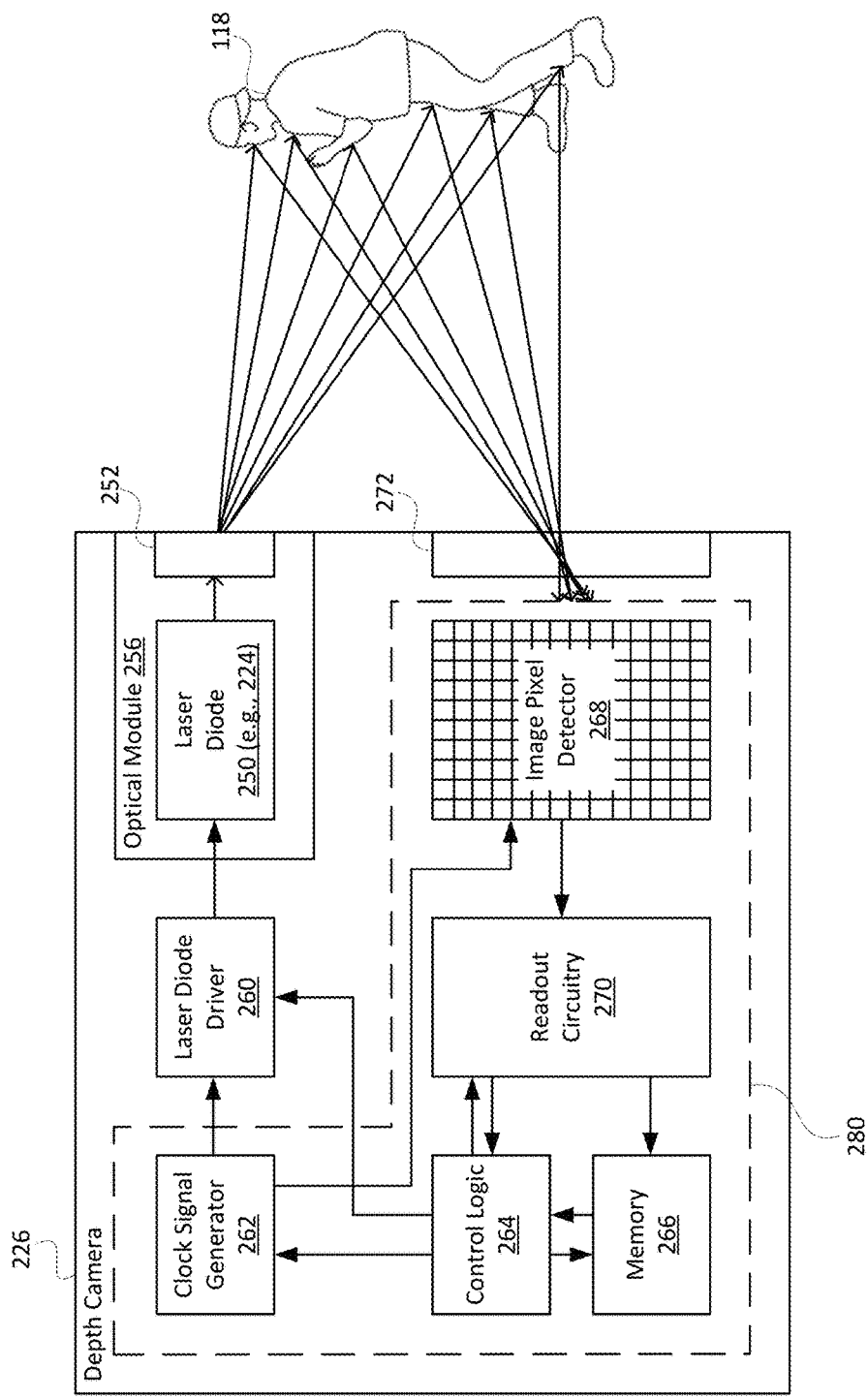
FIG. 2B illustrates an exemplary embodiment of a depth camera that may be part of the capture device of FIG. 2A.

FIG. 2B illustrates an example embodiment of a 3-D camera 226, which can also be referred to as a depth camera 226. The depth camera 226 is shown as including a laser diode driver 260 that drives a laser diode 250 of an optical module 256. The laser diode 250 can be, e.g., the IR light component 224 shown in FIG. 2A. More specifically, the laser diode 250 can be, e.g., an edge emitting laser diode or an array of vertical-cavity surface-emitting lasers (VCSELs). While it is likely that the laser diode emits IR light, light of alternative wavelengths can alternatively be emitted by the laser diode. Where a single laser diode 250 does not emit a desired amount of light, multiple optical modules can be included in the depth camera 226, each of which can be driven by a separate instance of the laser diode driver 260.

The depth camera 226 is also shown as including a clock signal generator 262, which produces one or more signals that is/are provided to the laser diode driver 260. For example, the clock signal generator can produce a modulation signal that is provided to the laser diode driver 260. The clock signal generator 262 can also provide clock signals to other components of the depth camera. Additionally, the depth camera 226 is shown as including control logic 264 that can control the clock signal generator 262 and/or the laser diode driver 260. The depth camera 226 is also shown as including an image pixel detector 268, readout circuitry 270 and memory 266. The image pixel detector 268 might include, e.g., 320×240 array of image pixel detectors or 512×512 array of image pixel detectors, but is not limited thereto. Each image pixel detector can be, e.g., a complementary metal-oxide-semiconductor (CMOS) sensor or a charged coupled device (CCD) sensor, but is not limited thereto. Depending upon implementation, each image pixel detector can have its own dedicated readout circuit, or readout circuitry can be shared by many image pixel detectors. In accordance with certain embodiments, the components of the depth camera 226 shown within the block 280 are implemented in a single integrated circuit (IC), which can also be referred to as an image sensor chip 280. In accordance with an embodiment, the laser diode driver 260 can be implemented in another chip. Alternatively, the laser diode driver 260 can also be within the image sensor chip 280. The depth camera can include additional components not shown, such as, but not limited to, a phase detector, a variable delay line, and the like.

In accordance with an embodiment, the laser diode driver 260 drives the laser diode 250 in dependence on one or more signals received from the image sensor chip 280 that are produced by or in dependence on the clock signal generator 262. Accordingly, the laser diode driver 260 can include, for example, one or more buffers, a pre-driver and an output stage, but is not limited thereto. The clock signal generator 262 can include, for example, one or more reference clocks and/or voltage controlled oscillators, but is not limited thereto. The clock signal generator 262 can also include, or operate with, a variable delay line and a phase detector. The control logic 264, which can be implemented using logic gate, a microprocessor and/or state machine, but is not limited thereto, can be used to control the clock signal generator 262 and/or the laser diode driver 260. For example, the control logic 264 can access waveform information stored in the memory 266 in order to produce an HF modulated drive signal. The depth camera 226 can includes its own memory 266 and control logic 264, as shown in FIG. 2B. Alternatively, or additionally, the processor 232 and/or memory 234 of the capture device 120 can be used to control aspects of the depth camera 226. For example, the image sensor chip 280 need not include its own microprocessor and/or memory.

In response to being driven by an HF modulated drive signal, the laser diode 250 emits an HF modulated laser beam, which can more generally be referred to as laser light. For an example, a carrier frequency of the HF modulated drive signal and the HF modulated laser light can be in a range from about 3 MHz to many hundreds of MHz, but for illustrative purposes will be assumed to be about 100 MHz. The laser light emitted by the laser diode 250 is transmitted through an optical structure 252, which can include one or more lens and/or other optical element(s), towards a target object (e.g., a user 118). The laser diode 250 and the optical structure 252 can be referred to, collectively, as an optical module 256. In accordance with certain embodiments of the present technology, the laser diode driver 260 is implemented using the embodiments described below with reference to FIGS. 6-9.

Assuming that there is a target object within the field of view of the depth camera, a portion of the laser light emitted by the optical module 256 reflects off the target object, passes through an aperture field stop and lens (collectively 272), and is incident on the image pixel detector 268 where an image is formed. In some implementations, each individual image pixel detector of the 268 produces an integration value indicative of a magnitude and a phase of detected HF modulated laser beam originating from the optical module 256 that has reflected off the object and is incident of the image pixel detector. Such integrations values, or more generally time-of-flight (TOF) information, enable distances (Z) to be determined, and collectively, enable depth images to be produced. In certain embodiments, optical energy from the laser diode 250 and detected optical energy signals are synchronized to each other such that a phase difference, and thus a distance Z, can be measured from each image pixel detector. The readout circuitry 270 converts analog integration values generated by the image pixel detector 268 into digital readout signals, which are provided to the microprocessor 264 and/or the memory 266, and which can be used to produce depth images. It is also possible that some other processor can produce the depth images.

Figure 3:
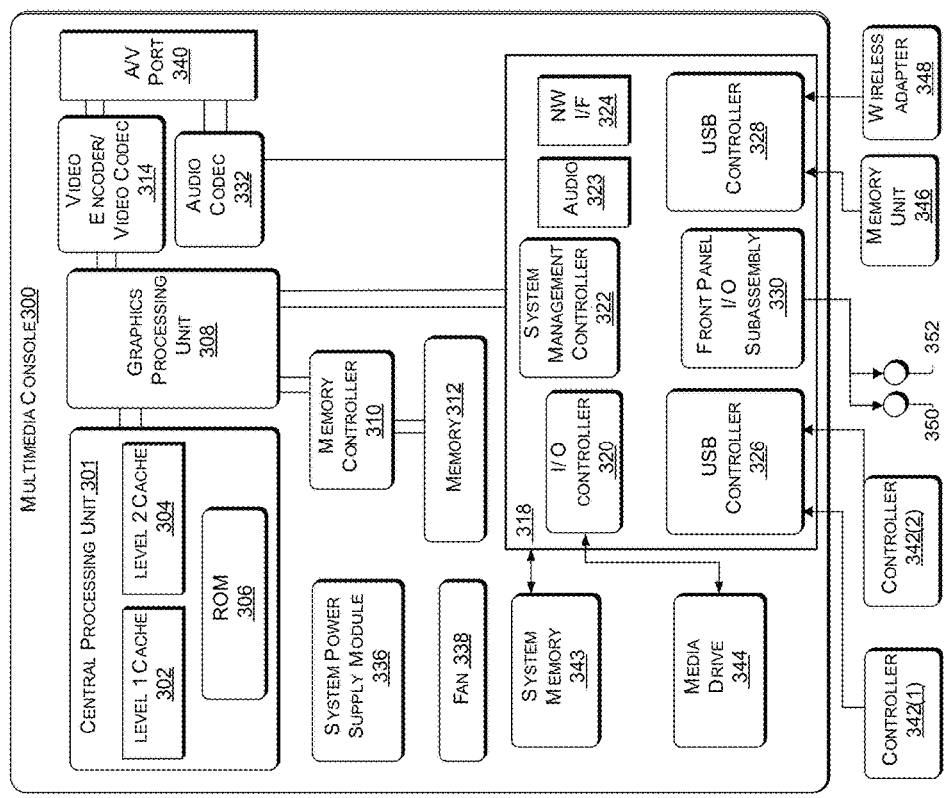
FIG. 3 illustrates an example embodiment of a computing system that may be used to track user behavior and update an application based on the user behavior.

FIG. 3 illustrates an example embodiment of a computing system that may be the computing system 112 shown in FIGS. 1A-2B used to track motion and/or animate (or otherwise update) an avatar or other on-screen object displayed by an application. The computing system such as the computing system 112 described above with respect to FIGS. 1A-2 may be a multimedia console, such as a gaming console. As shown in FIG. 3, the multimedia console 300 has a central processing unit (CPU) 301 having a level 1 cache 102, a level 2 cache 304, and a flash ROM (Read Only Memory) 306. The level 1 cache 302 and a level 2 cache 304 temporarily store data and hence reduce the number of memory access cycles, thereby improving processing speed and throughput. The CPU 301 may be provided having more than one core, and thus, additional level 1 and level 2 caches 302 and 304. The flash ROM 306 may store executable code that is loaded during an initial phase of a boot process when the multimedia console 300 is powered ON.

A graphics processing unit (GPU) 308 and a video encoder/video codec (coder/decoder) 314 form a video processing pipeline for high speed and high resolution graphics processing. Data is carried from the graphics processing unit 308 to the video encoder/video codec 314 via a bus. The video processing pipeline outputs data to an A/V (audio/video) port 340 for transmission to a television or other display. A memory controller 310 is connected to the GPU 308 to facilitate processor access to various types of memory 312, such as, but not limited to, a RAM (Random Access Memory).

The multimedia console 300 includes an I/O controller 320, a system management controller 322, an audio processing unit 323, a network interface 324, a first USB host controller 326, a second USB controller 328 and a front panel I/O subassembly 330 that are preferably implemented on a module 318. The USB controllers 326 and 328 serve as hosts for peripheral controllers 342(1)-342(2), a wireless adapter 348, and an external memory device 346 (e.g., flash memory, external CD/DVD ROM drive, removable media, etc.). The network interface 324 and/or wireless adapter 348 provide access to a network (e.g., the Internet, home network, etc.) and may be any of a wide variety of various wired or wireless adapter components including an Ethernet card, a modem, a Bluetooth module, a cable modem, and the like.

System memory 343 is provided to store application data that is loaded during the boot process. A media drive 344 is provided and may comprise a DVD/CD drive, Blu-Ray drive, hard disk drive, or other removable media drive, etc. The media drive 344 may be internal or external to the multimedia console 300. Application data may be accessed via the media drive 344 for execution, playback, etc. by the multimedia console 300. The media drive 344 is connected to the I/O controller 320 via a bus, such as a Serial ATA bus or other high speed connection (e.g., IEEE 1394).

The system management controller 322 provides a variety of service functions related to assuring availability of the multimedia console 300. The audio processing unit 323 and an audio codec 332 form a corresponding audio processing pipeline with high fidelity and stereo processing. Audio data is carried between the audio processing unit 323 and the audio codec 332 via a communication link. The audio processing pipeline outputs data to the A/V port 340 for reproduction by an external audio player or device having audio capabilities.

The front panel I/O subassembly 330 supports the functionality of the power button 350 and the eject button 352, as well as any LEDs (light emitting diodes) or other indicators exposed on the outer surface of the multimedia console 300. A system power supply module 336 provides power to the components of the multimedia console 300. A fan 338 cools the circuitry within the multimedia console 300.

The CPU 301, GPU 308, memory controller 310, and various other components within the multimedia console 300 are interconnected via one or more buses, including serial and parallel buses, a memory bus, a peripheral bus, and a processor or local bus using any of a variety of bus architectures. By way of example, such architectures can include a Peripheral Component Interconnects (PCI) bus, PCI-Express bus, etc.

When the multimedia console 300 is powered ON, application data may be loaded from the system memory 343 into memory 312 and/or caches 302, 304 and executed on the CPU 301. The application may present a graphical user interface that provides a consistent user experience when navigating to different media types available on the multimedia console 300. In operation, applications and/or other media contained within the media drive 344 may be launched or played from the media drive 344 to provide additional functionalities to the multimedia console 300.

The multimedia console 300 may be operated as a standalone system by simply connecting the system to a television or other display. In this standalone mode, the multimedia console 300 allows one or more users to interact with the system, watch movies, or listen to music. However, with the integration of broadband connectivity made available through the network interface 324 or the wireless adapter 348, the multimedia console 300 may further be operated as a participant in a larger network community.

When the multimedia console 300 is powered ON, a set amount of hardware resources are reserved for system use by the multimedia console operating system. These resources may include a reservation of memory (e.g., 16 MB), CPU and GPU cycles (e.g., 5%), networking bandwidth (e.g., 8 Kbps), etc. Because these resources are reserved at system boot time, the reserved resources do not exist from the application's view.

In particular, the memory reservation preferably is large enough to contain the launch kernel, concurrent system applications and drivers. The CPU reservation is preferably constant such that if the reserved CPU usage is not used by the system applications, an idle thread will consume any unused cycles.

With regard to the GPU reservation, lightweight messages generated by the system applications (e.g., popups) are displayed by using a GPU interrupt to schedule code to render popup into an overlay. The amount of memory required for an overlay depends on the overlay area size and the overlay preferably scales with screen resolution. Where a full user interface is used by the concurrent system application, it is preferable to use a resolution independent of application resolution. A scaler may be used to set this resolution such that the need to change frequency and cause a TV resynch is eliminated.

After the multimedia console 300 boots and system resources are reserved, concurrent system applications execute to provide system functionalities. The system functionalities are encapsulated in a set of system applications that execute within the reserved system resources described above. The operating system kernel identifies threads that are system application threads versus gaming application threads. The system applications are preferably scheduled to run on the CPU 301 at predetermined times and intervals in order to provide a consistent system resource view to the application. The scheduling is to minimize cache disruption for the gaming application running on the console.

When a concurrent system application requires audio, audio processing is scheduled asynchronously to the gaming application due to time sensitivity. A multimedia console application manager (described below) controls the gaming application audio level (e.g., mute, attenuate) when system applications are active.

Input devices (e.g., controllers 342(1) and 342(2)) are shared by gaming applications and system applications. The input devices are not reserved resources, but are to be switched between system applications and the gaming application such that each will have a focus of the device. The application manager preferably controls the switching of input stream, without knowledge the gaming application's knowledge and a driver maintains state information regarding focus switches. The cameras 226, 228 and capture device 120 may define additional input devices for the console 300 via USB controller 326 or other interface.

Figure 4:
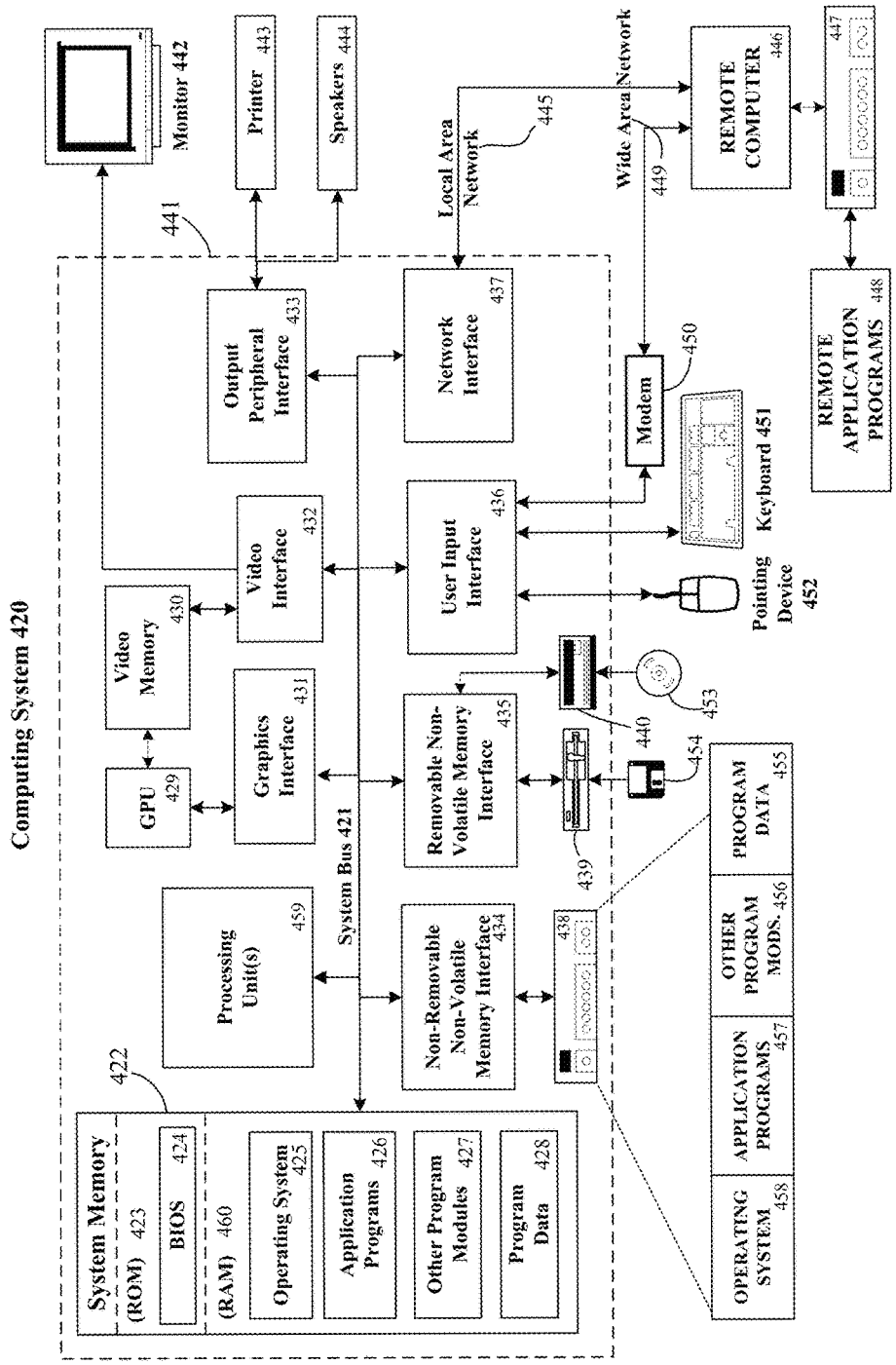
FIG. 4 illustrates another example embodiment of a computing system that may be used to track user behavior and update an application based on the tracked user behavior.

FIG. 4 illustrates another example embodiment of a computing system 420 that may be the computing system 112 shown in FIGS. 1A-2B used to track motion and/or animate (or otherwise update) an avatar or other on-screen object displayed by an application. The computing system 420 is only one example of a suitable computing system and is not intended to suggest any limitation as to the scope of use or functionality of the presently disclosed subject matter. Neither should the computing system 420 be interpreted as having any dependency or requirement relating to any one or combination of components illustrated in the exemplary computing system 420. In some embodiments the various depicted computing elements may include circuitry configured to instantiate specific aspects of the present disclosure. For example, the term circuitry used in the disclosure can include specialized hardware components configured to perform function(s) by firmware or switches. In other examples embodiments the term circuitry can include a general purpose processing unit, memory, etc., configured by software instructions that embody logic operable to perform function(s). In example embodiments where circuitry includes a combination of hardware and software, an implementer may write source code embodying logic and the source code can be compiled into machine readable code that can be processed by the general purpose processing unit. Since one skilled in the art can appreciate that the state of the art has evolved to a point where there is little difference between hardware, software, or a combination of hardware/software, the selection of hardware versus software to effectuate specific functions is a design choice left to an implementer. More specifically, one of skill in the art can appreciate that a software process can be transformed into an equivalent hardware structure, and a hardware structure can itself be transformed into an equivalent software process. Thus, the selection of a hardware implementation versus a software implementation is one of design choice and left to the implementer.

Computing system 420 comprises a computer 441, which typically includes a variety of computer readable media. Computer readable media can be any available media that can be accessed by computer 441 and includes both volatile and nonvolatile media, removable and non-removable media. The system memory 422 includes computer storage media in the form of volatile and/or nonvolatile memory such as read only memory (ROM) 423 and random access memory (RAM) 460. A basic input/output system 424 (BIOS), containing the basic routines that help to transfer information between elements within computer 441, such as during start-up, is typically stored in ROM 423. RAM 460 typically contains data and/or program modules that are immediately accessible to and/or presently being operated on by processing unit 459. By way of example, and not limitation, FIG. 4 illustrates operating system 425, application programs 426, other program modules 427, and program data 428.

The computer 441 may also include other removable/non-removable, volatile/nonvolatile computer storage media. By way of example only, FIG. 4 illustrates a hard disk drive 438 that reads from or writes to non-removable, nonvolatile magnetic media, a magnetic disk drive 439 that reads from or writes to a removable, nonvolatile magnetic disk 454, and an optical disk drive 440 that reads from or writes to a removable, nonvolatile optical disk 453 such as a CD ROM or other optical media. Other removable/non-removable, volatile/nonvolatile computer storage media that can be used in the exemplary operating environment include, but are not limited to, magnetic tape cassettes, flash memory cards, digital versatile disks, digital video tape, solid state RAM, solid state ROM, and the like. The hard disk drive 438 is typically connected to the system bus 421 through an non-removable memory interface such as interface 434, and magnetic disk drive 439 and optical disk drive 440 are typically connected to the system bus 421 by a removable memory interface, such as interface 435.

The drives and their associated computer storage media discussed above and illustrated in FIG. 4, provide storage of computer readable instructions, data structures, program modules and other data for the computer 441. In FIG. 4, for example, hard disk drive 438 is illustrated as storing operating system 458, application programs 457, other program modules 456, and program data 455. Note that these components can either be the same as or different from operating system 425, application programs 426, other program modules 427, and program data 428. Operating system 458, application programs 457, other program modules 456, and program data 455 are given different numbers here to illustrate that, at a minimum, they are different copies. A user may enter commands and information into the computer 441 through input devices such as a keyboard 451 and pointing device 452, commonly referred to as a mouse, trackball or touch pad. Other input devices (not shown) may include a microphone, joystick, game pad, satellite dish, scanner, or the like. These and other input devices are often connected to the processing unit 459 through a user input interface 436 that is coupled to the system bus, but may be connected by other interface and bus structures, such as a parallel port, game port or a universal serial bus (USB). The cameras 226, 228 and capture device 120 may define additional input devices for the computing system 420 that connect via user input interface 436. A monitor 442 or other type of display device is also connected to the system bus 421 via an interface, such as a video interface 432. In addition to the monitor, computers may also include other peripheral output devices such as speakers 444 and printer 443, which may be connected through a output peripheral interface 433. Capture Device 120 may connect to computing system 420 via output peripheral interface 433, network interface 437, or other interface.

The computer 441 may operate in a networked environment using logical connections to one or more remote computers, such as a remote computer 446. The remote computer 446 may be a personal computer, a server, a router, a network PC, a peer device or other common network node, and typically includes many or all of the elements described above relative to the computer 441, although only a memory storage device 447 has been illustrated in FIG. 4. The logical connections depicted include a local area network (LAN) 445 and a wide area network (WAN) 449, but may also include other networks. Such networking environments are commonplace in offices, enterprise-wide computer networks, intranets and the Internet.

When used in a LAN networking environment, the computer 441 is connected to the LAN 445 through a network interface 437. When used in a WAN networking environment, the computer 441 typically includes a modem 450 or other means for establishing communications over the WAN 449, such as the Internet. The modem 450, which may be internal or external, may be connected to the system bus 421 via the user input interface 436, or other appropriate mechanism. In a networked environment, program modules depicted relative to the computer 441, or portions thereof, may be stored in the remote memory storage device. By way of example, and not limitation, FIG. 4 illustrates application programs 448 as residing on memory device 447. It will be appreciated that the network connections shown are exemplary and other means of establishing a communications link between the computers may be used.

As explained above, the capture device 120 provides RGB images (also known as color images) and depth images to the computing system 112. The depth image may be a plurality of observed pixels where each observed pixel has an observed depth value. For example, the depth image may include a two-dimensional (2-D) pixel area of the captured scene where each pixel in the 2-D pixel area may have a depth value such as a length or distance in, for example, centimeters, millimeters, or the like of an object in the captured scene from the capture device.

Figure 5:
FIG. 5 illustrates an exemplary depth image.

FIG. 5 illustrates an example embodiment of a depth image that may be received at computing system 112 from capture device 120. According to an example embodiment, the depth image may be an image and/or frame of a scene captured by, for example, the 3-D camera 226 and/or the RGB camera 228 of the capture device 120 described above with respect to FIG. 2A. As shown in FIG. 5, the depth image may include a human target corresponding to, for example, a user such as the user 118 described above with respect to FIGS. 1A and 1B and one or more non-human targets such as a wall, a table, a monitor, or the like in the captured scene. The depth image may include a plurality of observed pixels where each observed pixel has an observed depth value associated therewith. For example, the depth image may include a two-dimensional (2-D) pixel area of the captured scene where each pixel at particular x-value and y-value in the 2-D pixel area may have a depth value such as a length or distance in, for example, centimeters, millimeters, or the like of a target or object in the captured scene from the capture device. In other words, a depth image can specify, for each of the pixels in the depth image, a pixel location and a pixel depth. Following a segmentation process, each pixel in the depth image can also have a segmentation value associated with it. The pixel location can be indicated by an x-position value (i.e., a horizontal value) and a y-position value (i.e., a vertical value). The pixel depth can be indicated by a z-position value (also referred to as a depth value), which is indicative of a distance between the capture device (e.g., 120) used to obtain the depth image and the portion of the user represented by the pixel. The segmentation value is used to indicate whether a pixel corresponds to a specific user, or does not correspond to a user.

In one embodiment, the depth image may be colorized or grayscale such that different colors or shades of the pixels of the depth image correspond to and/or visually depict different distances of the targets from the capture device 120. Upon receiving the image, one or more high-variance and/or noisy depth values may be removed and/or smoothed from the depth image; portions of missing and/or removed depth information may be filled in and/or reconstructed; and/or any other suitable processing may be performed on the received depth image.

Figure 6:
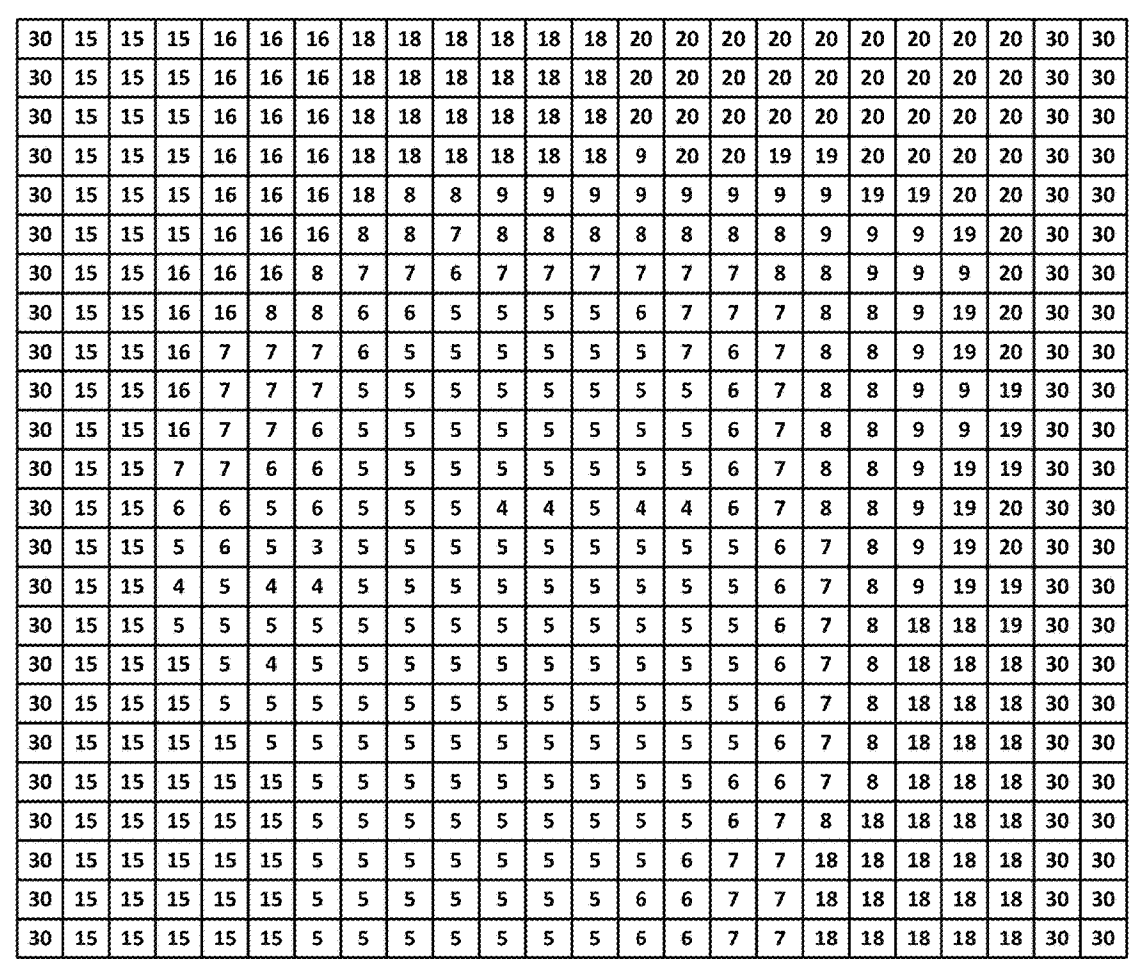

FIG. 6 provides another view/representation of a depth image (not corresponding to the same example as FIG. 5). The view of FIG. 6 shows the depth data for each pixel as an integer that represents the distance of the target to capture device 120 for that pixel. The example depth image of FIG. 6 shows 24×24 pixels; however, it is likely that a depth image of greater resolution would be used.

Laser Diode Driver

Figure 7:
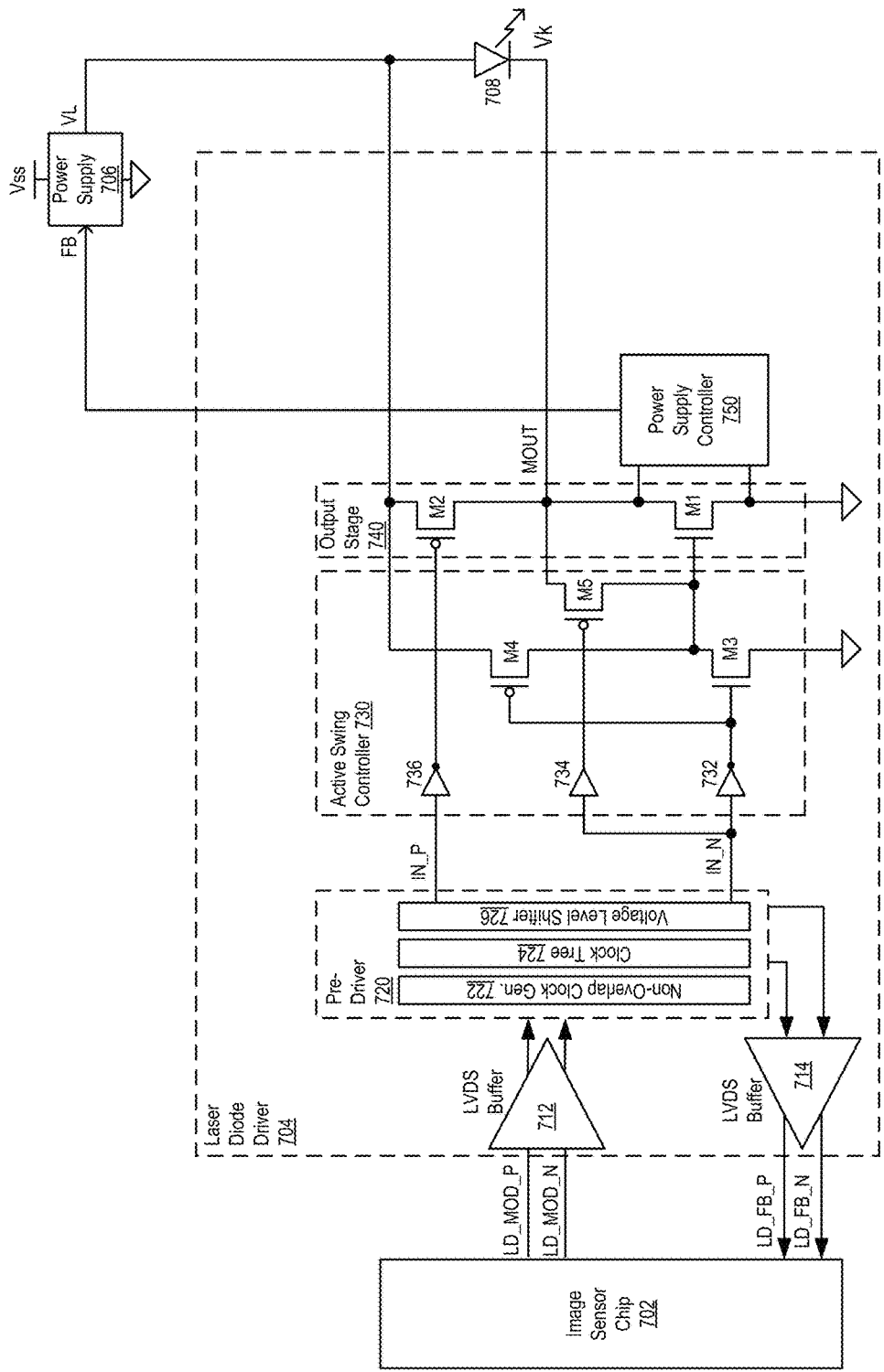
FIG. 7 illustrates a single-ended voltage mode laser diode driver circuit according to an embodiment.

Additional details of power efficient laser diode drivers, and methods for driving laser diodes, will now be described with reference to FIGS. 7-9. FIG. 7 includes a high level circuit diagram of a laser diode driver 704, according to an embodiment, which can also be referred to as a single-ended voltage mode laser diode driver 704. The laser diode driver 704 can be used, e.g., to implement the laser diode driver 260 described above with reference to FIG. 2B.

Referring to FIG. 7, the laser diode driver 704 is shown as including low-voltage differential signaling (LVDS) buffers 712, 714, a pre-driver 720, an active swing controller 730 and a main driver 740. In FIG. 7, the laser diode driver 704 is shown as receiving differential laser drive modulation signals LD_MOD_P, LD_MOD_N from an image sensor chip 702, but can alternatively receive the differential laser drive modulation signals from another circuit. As will be described in additional detail below, in dependence on the differential laser drive modulation signals LD_MOD_P, LD_MOD_N, the laser diode driver 704 either pulls down or pulls up the voltage at the node labeled MOUT in order to, respectively, turn on a laser diode 708 or turn off the laser diode 708. Where the laser diode driver 704 is used to implement the laser diode driver 260 described above with reference to FIG. 2B, the laser diode 708 is equivalent to the laser diode 250 shown in FIG. 2B. Exemplary details of at least some of the components of the image sensor chip 702 were described above with reference to the block 280 of FIG. 2B.

In the embodiment of FIG. 7, the anode of the laser diode 708 is connected to a voltage output of a power supply 706, and the cathode of the laser diode 708 is connected to a node MOUT. The power supply 706, which can be a DC-DC converter or a linear voltage regulator, but is not limited thereto, produces an adjustable voltage level VL. The adjustable voltage level VL output by the power supply 706 is adjusted in dependence on a feedback (FB) signal received from a power supply controller 750, exemplary details of which are described below. When the voltage level at the MOUT node (which can also be referred to as the MOUT voltage) is pulled down toward ground, a drive current flows through the laser diode 708 to ground and the laser diode 708 is turned on and emits light. When voltage level at the MOUT node is pulled up toward the voltage level VL output by the power supply 706, the drive current stops flowing through the laser diode 708 and the laser diode 708 is turned off and does not emit light. Additional details of this operation are described below.

The pre-driver 720, which can also be referred to as a pre-driver circuit, is shown as including a non-overlapping clock generator 722, a clock tree 724 and a voltage level shifter 726, but is not limited thereto. The pre-driver 720 receives buffered versions of the differential laser drive modulation signals LD_MOD_P, LD_MOD_N from the LVDS buffer 712, and generates differential laser drive modulation signals IN_P, IN_N, which are provided to the active swing controller 730, and also generates and distributes clock signals for other components of the laser diode driver 704. The pre-driver 720 can increase the edge rate of the differential laser drive modulation signals and/or adjust levels of these modulation signals to the appropriate levels for driving the large NMOS device M1 of the main driver 740. The non-overlapping clock generator 722 can generate a non-inverting clock signal and inverting clock signal that respectively transition before a delayed non-inverting clock signal and a delayed inverting clock signal. There can also a delay between transitions of the non-inverting clock signal and the inverting clock signal that can be adjusted to selectively adjust a delay between LD_MOD_P and LD_MOD_N. The clock tree 724 receives the clock signals from the non-overlapping clock generator 722 and distributes the clock signals to other components of the laser diode driver 704. In accordance with specific embodiments, the frequency of the high frequency modulation signal is within the range of 16 MHz to 160 MHz, and in accordance with an embodiment is approximately 150 MHz. The use of other frequencies are also possible, and within the scope of an embodiment. The voltage level shifter 726 shifts the high logic voltage level of the differential laser drive modulation signals LD_MOD_P, LD_MOD_N from a high voltage rail level (Vss) to the voltage level (VL) at the voltage output of the power supply 706, causing the high logic voltage level of the differential laser drive modulation signals IN_P, IN_N to be the voltage level (VL) at the voltage output of the power supply 706. For example, the voltage level shifter 726 may shift the high logic voltage level from about 3.3V to about 2V, which improves the power efficiency of the laser diode driver 704. In an alternative embodiment, the pre-driver 720 does not include a voltage level shifter 321. The differential laser drive modulation signals IN_P, IN_N output by the pre-driver 720 can collectively be referred to as a high frequency modulation signal, or simply as a modulation signal.

In accordance with an embodiment, the pre-driver 720 and the LVDS buffer 714 provide different feedback signals LD_FB_P, LD_FB_N to the image sensor chip 702. This enables the image sensor chip 702, presuming it includes a phase detector, to measure the phase of the high frequency modulation signal for the purpose of maintaining a constant desired phase.

Before describing the active swing controller 730, it is first useful to describe the main driver 740. The main driver 740, which can also be referred to as the output stage 740, is shown as including an NMOS device M1 and a PMOS device M2, which can also be referred to as the output stage transistors M1 and M2. The NMOS device M1 (which is the main driving transistor, and thus may be referred to as the main NMOS device M1) and the PMOS device M2 are selectively turned on and off to selectively pull the voltage level at the MOUT node, to which the cathode of the laser diode 708 is connected, down towards ground or up towards the voltage level VL output by the power supply 706. More specifically, when the NMOS device M1 is turned on (in response to its gate being pulled up) and the PMOS device M2 is turned off (in response to its gate being pulled down), the MOUT node (connected to the cathode of the laser diode 708) is pulled toward ground, which causes a current to flow through the laser diode 708, thereby causing the laser diode 708 to turn on and emit light. When the NMOS device M1 is turned off (in response to its gate being pulled down) and the PMOS device M2 is turned on (in response to its gate being pulled up), the voltage level at the MOUT node (connected to the cathode of the laser diode 708) is pulled up towards the voltage level VL output by the power supply 706, which causes the current to stop flowing through the laser diode 708, thereby causing the laser diode 708 to turn off and not emit light. An advantage of this configuration is that current does not flow through the laser diode 708 when the laser diode 708 is turned off and not emitting light, which contributes to the high efficiency of the laser diode driver 704. Another advantage of this configuration is that there is no current source in series with the main NMOS device M1. This contributes to the high efficiency of the laser diode driver 704, decreases the on-chip voltage drop while current is flowing through the laser diode 708 and saves chip area.

In accordance with an embodiment, the main NMOS device M1 is a strong transistor, and the PMOS device M2 is a weak transistor. For example, the width/length ratio of the main NMOS device M1 can be between 10 and 100 times greater (e.g., 80 times greater) than the width/length ratio of the PMOS device M2.

The single-ended voltage mode laser diode driver 704, described with reference to FIG. 7, provides high power efficiency. In accordance with specific embodiments, the power efficiency of the laser diode driver 704 can be up to 85 percent, since the output transistors M1 and M2 are capable of driving outputs of up to 10 A with low voltage drip. More generally, the laser current can be set to be between about 6 A and 10 A, but can alternatively be scaled up or scaled down as desired. The largest efficiency loss in the laser diode driver 704 is due to power spent charging the output transistors M1 and M2, wherein such power is proportional to modulation frequency and is about 2 W at a modulation frequency of 150 MHz. Additionally, the single-ended voltage mode laser diode driver 704 enables the total transistor area to be minimized for a given current carrying capacity, thereby reducing the total cost and size of a depth camera including the laser diode driver 704.

For the following description, the current that flows through the laser diode 708 can also be referred to as the laser current, the voltage level at the MOUT node can also be referred to as the MOUT voltage, and the voltage level VL at the output of the power supply 706 can also be referred to as the VL voltage or simply as VL. When the laser current is turned off, in response to the NMOS device M1 being turned off, due to Lenz's law inductive kickback from the laser diode 708 will attempt to boost the MOUT voltage (which in this embodiment is the cathode voltage Vk of the laser diode 708) above the voltage level VL output by the power supply 706 (which is above the voltage of one of the laser terminals). This inductive kickback, if not limited or avoided, can damage components of the laser diode driver 704, and can adversely affect how long it takes to turn off of the laser diode 708. Conventionally, as discussed above with reference to FIGS. 10 and 11, an external clamping diode Dclamp had been used to limit the inductive kickback. However, use of an external clamping diode is very crude and does not prevent high currents caused by the clamping. In accordance with an embodiment, the active swing controller 730 of the laser diode driver 704 is configured to substantially eliminate the inductive kickback related overswing above the voltage level VL output by the power supply 706, without the need for any other outside active components to prevent damage of the main driver 740 and the laser diode 708. This allows for more tightly designed layouts and a more compact overall system, as there is no need to account for more excessive safeguards. Additional details of the active swing controller 730 are provided below.

Still referring to FIG. 7, the active swing controller 730, which can also be referred to as an active swing control circuit, is shown as including an inverter 732, a buffer 734, an inverter 736, an NMOS device M3, and PMOS devices M4 and M5. The NMOS device M4, which can also be referred to as transistor M4, is a strong PMOS gate drive device for the main NMOS device M1. The NMOS device M3, which can also be referred to as transistor M3, is a weak NMOS discharge device for the main NMOS device M1. The PMOS device M5, which can also be referred to as transistor M5, is a diode connect switch for the main NMOS device M1. As the terms are used herein, the terms "weak" and "strong" refer to the relative drive capabilities of transistor devices. Weak transistors are transistors with lower width/length ratios. Strong transistors are transistors with higher width/length ratios. In a specific embodiment, the weak NMOS device M3 has a width/length ratio that is about eighty times smaller than the width/length ratio of the main NMOS device M1, and the PMOS device M4 has a width/length ratio that is only about four times smaller than the width/length ratio of the main NMOS device M1. Thus, in such an embodiment, the strong PMOS gate drive device M4 has a width/length ratio that is about twenty times larger than the weak NMOS discharge device M3. Operation of the active swing controller 730 is explained below.

When IN_P goes low (i.e., towards ground) and IN_N goes high (i.e., towards VL, or alternatively towards Vss): the output of the inverter 736 will be high, which turns off the PMOS device M2; the output of the buffer 734 will be high, which turns off the PMOS device M5; and the output of the inverter 732 will be low, which turns off the NMOS device M3 and turns on the PMOS device M4. This turning on of the PMOS device M4 pulls the gate of the main NMOS device M1 up toward the VL voltage, which turns on the main NMOS device M1. As explained above, this causes laser current to flow through the laser diode 708, in response to which the laser diode 708 turns on and emits light. The above cycle can be referred to as the turn-on cycle, since it turns on the laser diode 708. During the turn-on cycle, the gate of the main NMOS device M1 is driven high substantially instantaneously via the very strong PMOS device M4, which can also be referred to as a very strong PMOS gate drive device for the main NMOS device M1. This results in a very fast discharge of a reverse junction capacitance of the laser diode 708 through the main NMOS device M1 to ground and turns on the laser diode 708 very fast, only limited by the inductance time resistance limitation of parasitic inductances between VL, the laser diode, its package and the laser diode driver 704.

When IN_P goes high and IN_N goes low: the output of the inverter 736 will be low, which turns on the PMOS device M2; the output of the buffer 734 will be low, which turns on the PMOS device M5; and the output of the inverter 732 will be high, which turns on the NMOS device M3 and turns off the PMOS device M4. This turning off of the PMOS device M4 pulls the gate of the main NMOS device M1 down toward ground, which turns off the main NMOS device M1. As explained above, this causes laser current to stop flowing through the laser diode 708, in response to which the laser diode 708 turns off and stops emitting light. The above cycle can be referred to as the turn-off cycle, since it turns off the laser diode 708. During the turn-off cycle, the gate of the main NMOS device M1 is discharged slowly via the weak NMOS discharge device M3, and the PMOS diode connect switch M5 is closed, which connects the gate of the main NMOS device M1 to its drain, and thus causes the main NMOS device M1 to be diode-connected. Advantageously, this results in a slow actively controlled discharge of the voltage at the gate of the main NMOS device M1, which keeps the NMOS device M1 on just enough to prevent the MOUT node from spiking above the VL voltage due to Lenz's law. This slow discharge of the voltage at the gate of the main NMOS device M1 continues until currents resulting from inductances of the package, a board (to which the various devices are connected) and laser diode 708 have completely decayed and the main NMOS device M1 is completely turned off.

The PMOS device M2 is a weak switching transistor that is controlled synchronously with the high frequency modulation signal received by the laser diode driver 704 in order to provide a discharge path across the laser diode 708 to shunt the inductive kickback current from the laser diode 708 during the turn-off cycle.

The time between when the main NMOS device M1 is completely tuned off, and when the next turn on cycle begins can be referred to as the off cycle. During the off cycle, the weak PMOS device M2 is turned on, which prevents open circuit ringing that would otherwise occur due to the main NMOS device M1 being turned off. More specifically, the PMOS device M2 functions as an impedance match device to substantially eliminate ringing at the MOUT node during the off cycle. Advantageously, during the off cycle the current flowing from the power supply, through the circuitry including the laser diode driver 704 and the laser diode 708, is substantially less than during the on cycle, which contributes to the high power efficiency of the laser diode driver 704.

In accordance with specific embodiments, the timing associated with turning off and on the main NMOS device M1 and the impedance matching PMOS device M2 is precisely controlled by precisely controlling the timing of the IN_N and IN_P signals using the non-overlapping clock generator 722 and/or the clock tree 724 of the pre-driver 720. In accordance with an embodiment, overlap times during which both the NMOS device M1 and the PMOS device M2 are both turned on are substantially avoided to prevent a high current short between the output of the power supply 706 and ground. Additionally, dead times during which neither the NMOS device M1 nor the PMOS device M2 is turned on are also substantially avoided, because such dead times would allow time for inductive kickback to boost the MOUT voltage above the VL voltage.

In accordance with certain embodiments, the voltage level VL output by the power supply 706 is controlled to provide a substantially minimum amount of voltage required for the laser diode 708 to emit a predetermined desired light power. This regulates the power (and more specifically, the voltage VL) provided to the anode of the laser diode 708 to increase and preferably maximize power efficiency. This is accomplished using the power supply controller 750, which generates a feedback (FB) signal that is used to adjust the voltage level (VL) output by the power supply 706. Additional details of the power supply controller 750, according to an embodiment, will now be described with reference to FIG. 8.

Figure 8:
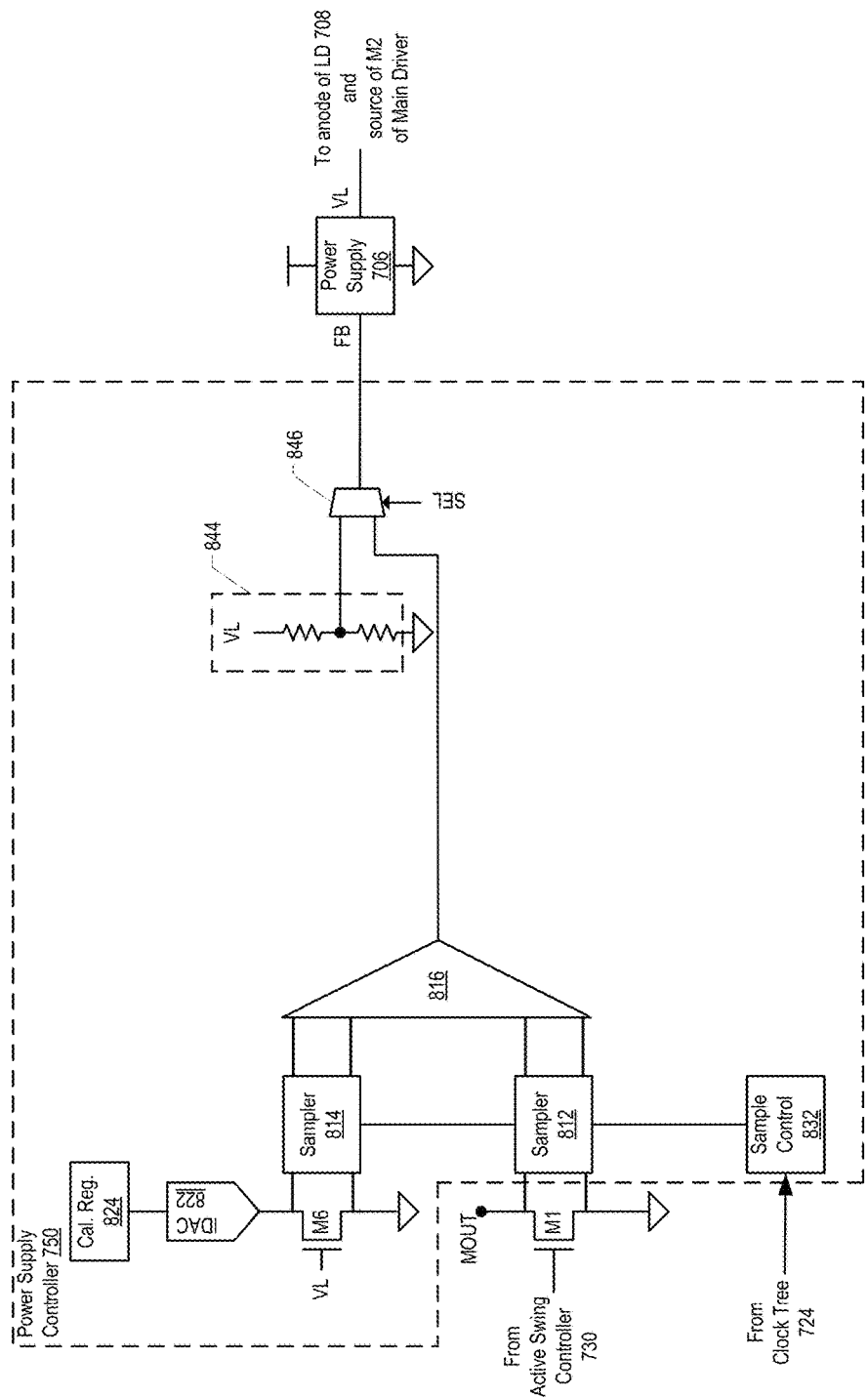
FIG. 8 illustrates details, according to an embodiment, of the power supply controller of the laser diode driver shown in FIG. 7.

Referring to FIG. 8, the power supply controller 750, in accordance with an embodiment, is shown as including a pair of samplers 812 and 814, a dual fully-differential input differential amplifier 816, a voltage divider 844 and a multiplexer 846. The samplers 812 and 814 are controlled by a sample controller 832 in order to sample the drain-to-source voltages of the transistors M1 and M6, while the laser diode 708 is on and emitting light. More specifically, the sampler 812 produces samples of the drain-to-source voltage (VDS) of the transistors M1, and the sampler 814 produces samples of the drain-to-source voltage (VDS) of the transistor M6, preferably during the points of maximum current through the transistor M1. The transistor M1 is the main NMOS device of the main driver 740, which was shown in and discussed above with reference to FIG. 7. The transistor M6 is a reference NMOS device that produces a reference drain-to-source voltage indicative of a desired laser diode current. Accordingly, the transistor M6 can also be referred to as a reference NMOS transistor M6. In an embodiment, timing information from the clock tree 724 enables the sample controller 832 to sample the drain-to-source voltage of the main NMOS device M1 at the correct time so that the drain-to-source voltage of the main NMOS device M1 is proportional to, and thereby indicative of, the drive current supplied to the laser diode 708.

During a calibration procedure, a digital value is stored in a calibration register 824, wherein the digital value is used to specify a desired current through the laser diode 708. This digital value is converted to a current by a current digital-to-analog converter (DAC) 822, which causes the transistor M6 to produce the reference drain-to-source voltage. A dual fully-differential input differential amplifier 816 determines a difference between the drain-to-source voltage samples produced by the sampler 812 and the reference drain-to-source voltage samples produced by the sampler 814, and outputs a signal indicative of the difference. A multiplexer 846 provides the output of the dual fully-differential input differential amplifier 816, or an amplified, filtered and/or otherwise modified version thereof, to the feedback FB input of the power supply 706 while the laser diode 708 is turned on and emitting light in response to being driven. The multiplexer 846 provides a voltage level produced by the voltage divider 844 to the feedback input of the power supply 706 when the laser diode 708 is turned off and not emitting light.

When the laser diode 708 is turned on and emitting light, a primary feedback loop produces the feedback (FB) signal that is used to adjust the voltage level VL at the voltage output of the power supply 706 to cause the actual laser diode current while the laser diode 708 is on and emitting light to be substantially equal to the desired laser diode current. In accordance with the embodiment shown in FIG. 8, the primary feedback loop advantageously does not include any current sensing resistors which would decrease the efficiency of the laser diode driver 704. The voltage divider 844 is used as part of a secondary feedback loop to keep the voltage level VL at the voltage output by the power supply 706 at a reasonable voltage during those times that the laser diode 708 is not being driven to emit light. One of ordinary skill in the art would understand from the above description that the power supply controller 750 can be implemented using alternative and/or additional circuitry, while still being within an embodiment of the present technology.

Referring back to FIG. 7, the laser diode driver 704 can also perform secondary power control by controlling the duty-cycle control of differential laser drive modulation signals LD_MOD_P, LD_MOD_N. Manipulation of the light waveforms produced by the laser diode 708 in this manner can be used to optimize the tradeoff between light power and depth measurement precision. In accordance with specific embodiments, the pre-driver 720 is used to perform such duty-cycle control.

Figure 11:
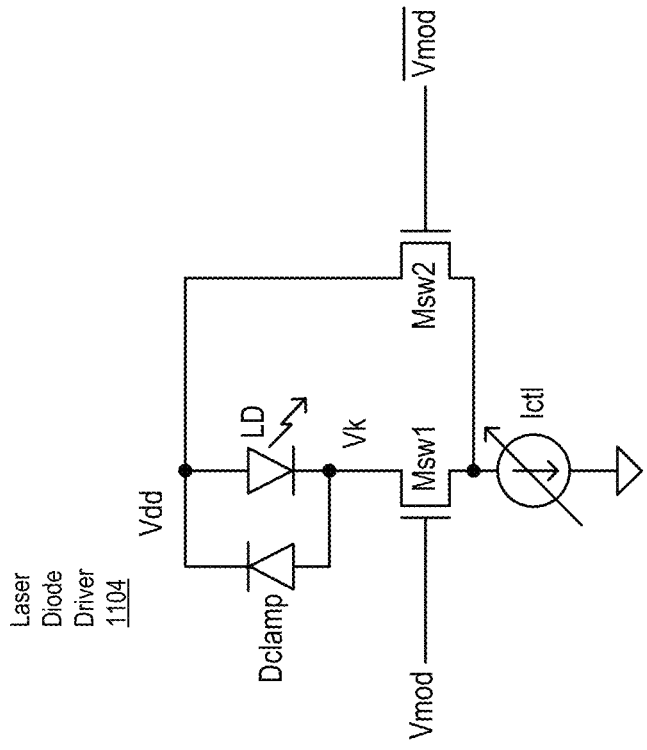
FIG. 11 illustrates a prior art differential current mode laser diode driver circuit.
Figure 10:
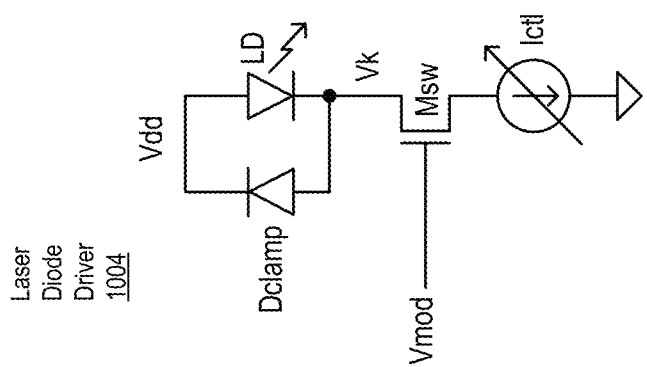
FIG. 10 illustrates a prior art single-ended current mode laser diode driver circuit.

The laser diode driver 704, described with reference to FIG. 7, advantageously provides for effective voltage kick-back clamping without the need for an external clamp diode (Dclamp), which was used in the laser diode drivers 1004 and 1104 shown, respectively, in FIG. 10 and FIG. 11. This enables the user of a lower voltage semiconductor process and eases printed circuit board layout.

In accordance with an embodiment, the laser diode driver 704 is a chip that is designed to support a flip chip package. In such a chip, core area pads greatly reduce the need for larger, lossy on-chip metal routes and improve thermal conduction from the on-chip driver circuitry to the printed circuit board (PCB) to which the laser diode driver chip is attached. Preferably, the package for the laser diode driver chip is designed to substantially minimize parasitics and maximize thermal-conduction by placing vertical routes direct from the chips pads through the package to the PCB. This enable the PCB system to deliver substantially optimal power efficiency due to low inductance and low on chip IR drop.

In accordance with an alternative embodiment, the laser diode 708 can be driven using an H-bridge configuration, in which case the main driver (i.e., output stage) would include an additional NMOS device and an additional PMOS device. In other words, an H-bridge output stage would include a pair of NMOS devices and a pair of PMOS devices connected in an H-bridge configuration. When using the H-bridge configuration, when the laser diode 708 is on an emitting light current flows from the power supply 706, through one of the PMOS devices of the output stage, through the laser diode 708, and through one of the NMOS devices of the output stage to ground. The laser diode 708 would be turned off by a reverse bias applied from the power supply, the other one of the PMOS devices and the other one of the NMOS devices of the output stage. The H-bridge configuration can be used to substantially minimize the turnoff time of the laser diode 708 at the expense of additional laser diode driver chip area and additional power relative to the single-ended configuration shown in and described with reference to FIG. 7. If such an H-bridge configuration were to be used, the active swing controller 730 and the power supply controller 750 would need to be slightly modified to operate with the H-bridge configuration, as would be understood by one of ordinary skill in the art in view of the above discussions of the active swing controller 730 and the power supply controller 750.

Referring back to FIG. 7, in accordance with an alternative embodiment, the anode of the laser diode 708 is connected to the MOUT node of the output stage 740 (instead of to the voltage output node of the power supply) and the cathode of the laser diode 708 is connected to ground (instead of to the MOUT node). In such an embodiment, the PMOS device M2 of the output stage 740 will be the strong main driving transistor, and the NMOS device M1 of the output stage 740 will be the weak impedance matching device that eliminates ringing at the MOUT node during the off cycle. Further, in such an alternative embodiment, to achieve the benefits described above with reference to FIG. 7, the circuitry of the active swing controller should be modified, as would be understood by one of ordinary skill in the art, so that: during a turn-on cycle, the gate of the main PMOS device M2 is driven low substantially instantaneously to turn on very fast; and during a turn-off cycle, the gate of the main PMOS device M2 is charged up slowly, so the PMOS device M2 on just enough to keep the MOUT node from spiking below ground due to Lenz's law. Additionally, during the turn-off cycle, the gate of the main PMOS device M2 should be connected to its drain to cause the main PMOS device M2 to be diode-connected. Further, in this alternative embodiment, the weak NMOS device M2 provides a discharge path across the laser diode 708 to shunt the inductive kickback current from the laser diode 708 during the turn-off cycle. Additionally, in this alternative embodiment, the power supply controller 750 will instead be connected between the drain and source of the PMOS device M2 to produce a feedback signal that is provided to the power supply 706 in order to adjust the voltage level of the voltage output of the power supply 706 in dependence the drain-to-source voltage of the PMOS device M2 while the laser diode is turned on, which is indicative of an actual laser diode current while the laser diode is on and emitting light.

Figure 9:
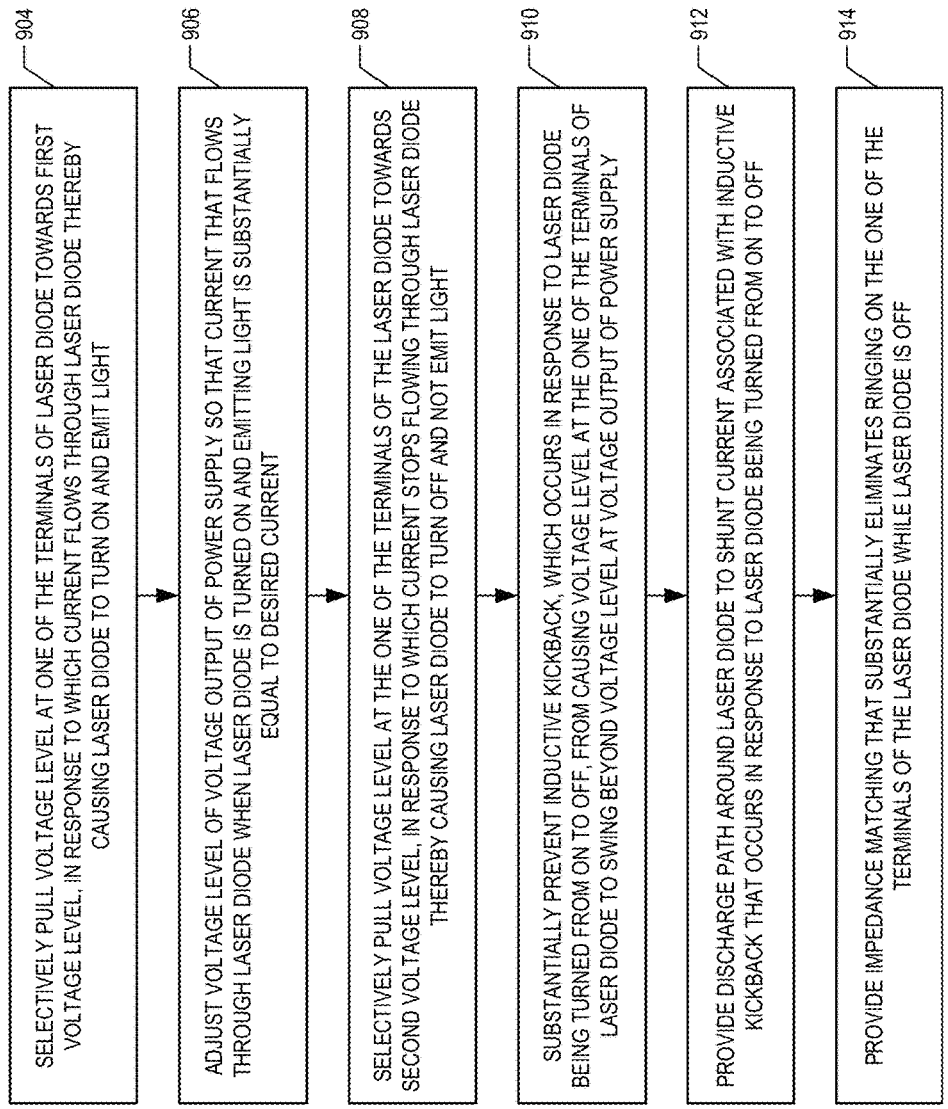
FIG. 9 is a high level flow diagram that is used to summarize methods according to various embodiments of the present technology.

The high level flow diagram of FIG. 9 will now be used to describe methods in accordance with certain embodiments of the present technology. Referring to FIG. 9, as indicated at step 904, a voltage level at one of the terminals of the laser diode is selectively pulled toward a first voltage level, in response to which current flows through the laser diode causing the laser diode to turn on and emit light. For example, if the anode terminal of the laser diode is connected to the voltage output of a power supply (e.g., 706) and the cathode terminal is connected to an output node of an output stage (e.g., MOUT), then a voltage level at the cathode of the laser diode can be selectively pulled down towards ground in response to which a current flows through the laser diode causing the laser diode to turn on and emit light. Alternatively, if the cathode terminal of the laser diode is connected to ground and the anode terminal of the laser diode is connected to an output node of an output stage, then a voltage level at the anode of the laser diode can be selectively pulled up towards the voltage level at the voltage output of the power supply (e.g., 706), in response to which a current flows through the laser diode causing the laser diode to turn on and emit light.

At step 906, the voltage level of the voltage output of the power supply is adjusted so that the current that flows through the laser diode when the laser diode is turned on and emitting light is substantially equal to a predetermined desired current. Step 906 can be performed, e.g., using the power supply controller 750, exemplary described of which were described above with reference to FIGS. 7 and 8.

As indicated at step 908, the voltage level at the one of the terminals of the laser diode is selectively pulled towards a second voltage level, in response to which current stops flowing through the laser diode causing the laser diode to turn off and not emit light. For example, if the anode terminal of the laser diode is connected to the voltage output of a power supply (e.g., 706) and the cathode terminal is connected to an output node of an output stage, then the voltage level at the cathode is pulled towards the voltage level at the voltage output of the power supply, in response to which current stops flowing through the laser diode causing the laser diode to turn off and not emit light. Alternatively, if the cathode terminal of the laser diode is connected to ground and the anode terminal of the laser diode is connected to an output node of an output stage, then a voltage level at the anode of the laser diode can be pulled towards ground, in response to which current stops flowing through the laser diode causing the laser diode to turn off and not emit light. Referring briefly back to FIG. 7, steps 904 and 908 can be performed using the main driver 740, which as mentioned above, can also be referred to as the output stage 740.

Referring again to FIG. 9, as indicated at step 910, inductive kickback, which occurs in response to the laser diode being turned from on to off, is substantially prevented from causing the voltage level at the one of the terminals of the laser diode from swinging beyond the second voltage level. For example, if the anode terminal of the laser diode is connected to the voltage output of a power supply (e.g., 706) and the cathode terminal is connected to an output node of an output stage, then step 910 involves preventing boosting (and more generally, swinging) of the voltage level at the cathode of the laser diode above the voltage level at the voltage output of the power supply. Alternatively, if the cathode terminal of the laser diode is connected to ground and the anode terminal of the laser diode is connected to an output node of an output stage, then step 910 involves preventing the voltage level at the anode of the laser diode from being pulled below (and more generally, swinging below) ground. Referring briefly back to FIG. 7, the active swing controller 730 can be used to perform step 910.

Referring again to FIG. 9, as indicated at step 912, a discharge path around the laser diode is provided to shunt a current associated with the inductive kickback that occurs in response to the laser diode being turned from on to off. As indicated at step 914, impedance matching is provided that substantially eliminates ringing on the one of the terminals of the laser diode (that is connected to the output node of the output state), and more generally on the output node of the output stage, while the laser diode is off. For example, if the anode terminal of the laser diode is connected to the voltage output of a power supply (e.g., 706) and the cathode terminal is connected to the output node (e.g. MOUT) of the output stage (e.g., 740), then the PMOS device M2 of the output stage 740 (also referred to as the main driver 740) in FIG. 7 can be used to perform step 914. Alternatively, if the cathode terminal of the laser diode is connected to ground and the anode terminal of the laser diode is connected to the output node (e.g., MOUT) of the output stage (e.g., 740), then the NMOS device N1 of the output stage 740 can be used to perform step 914.

The steps shown in and described with reference to FIG. 9 are not necessarily performed in the order shown. Rather, the order of at least some of the steps can be modified, and multiple steps may occur at the same time. For an example, steps 910 and 912 can be performed simultaneously. Additional details of methods according to embodiments of the present technology can be appreciated from the above discussion of FIGS. 7 and 8.

Embodiments of the present technology have been described above with the aid of functional building blocks illustrating the performance of specified functions and relationships thereof. The boundaries of these functional building blocks have often been defined herein for the convenience of the description. Alternate boundaries can be defined so long as the specified functions and relationships thereof are appropriately performed. Any such alternate boundaries are thus within the scope and spirit of the present technology. For example, it would be possible to combine or separate some of the steps shown in FIG. 9. For another example, it is possible to change the boundaries of some of the blocks shown in FIGS. 7 and 8.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims. It is intended that the scope of the technology be defined by the claims appended hereto.

What is claimed is:

1. A depth camera system, comprising:
a power supply including a voltage output;
a laser diode including an anode terminal and a cathode terminal;
a laser diode driver including an output stage, the output stage including first and second transistors, the laser diode driver configured to:
selectively turn the first and second transistors on and off to selectively pull a voltage level at an output node of the output stage down toward ground to cause current to flow from the voltage output of the power supply through the laser diode, which causes the laser diode to turn on and emit light, and
selectively turn the first and second transistors on and off to selectively pull the voltage level at the output node of the output stage up toward a voltage level at the voltage output of the power supply to cause substantially no current to flow from the voltage output of the power supply through the laser diode, which causes the laser diode to turn off and not emit light;

an image pixel detector configured to detect light originating from the laser diode that has reflected off an object and is incident of the image pixel detector; and one or more processors configured to produce depth images in dependence on outputs of the image pixel detector, and configured to update an application based on the depth images.

2. The system of claim 1, wherein the laser diode driver includes a power supply controller configured to adjust the voltage level of the voltage output of the power supply so that the current that flows through the laser diode when the laser diode is turned on and emitting light is substantially equal to a predetermined desired laser diode current.

3. The system of claim 2, wherein the power supply controller is configured to produce a feedback signal that is used by the power supply to adjust the voltage level at the voltage output of the power supply.

4. The system of claim 3, wherein the power supply controller comprises:
   a reference device that produces a reference drain-to-source voltage indicative of the predetermined desired laser diode current;
   a first sampler configured to selectively sample a drain-to-source voltage of a device of the output stage of the laser diode driver to produce a drain-to-source voltage sample indicative of an actual current that flows through the laser diode when the laser diode is turned on and emitting light;
   a second sampler configured to selectively sample the drain-to-source voltage of the reference device to produce a drain-to-source voltage sample that is indicative of the desired laser diode current;
   a sample controller configured to control the first and second samplers to sample the drain-to-source voltages of the reference device and the device of the output stage while the laser diode is turned on and emitting light; and
   a differential amplifier configured to determine a difference between the drain-to-source voltage samples produced by the first and second samplers and output a signal indicative of the difference and that is used as the feedback signal while the laser diode is turned on and emitting light.

5. The system of claim 4, wherein:
   the signal output by the differential amplifier, which is indicative of the difference between the drain-to-source voltage samples produced by the first and second samplers, is produced using a primary feedback loop of the laser diode driver and is used as the feedback signal while the laser diode is turned on and emitting light; and
   another signal, which is produced using a secondary feedback loop of the laser diode driver, is used as the feedback signal while the laser diode is turned off and not emitting light, in order to keep the voltage level at the voltage output of the power supply at at least a specified level while the laser diode is not emitting light.

6. The system of claim 1, wherein the first and second transistors of the output stage include an NMOS device and a PMOS device that are selectively turned on and off to selectively pull the voltage level at the output node of the output stage of the laser diode driver, to which the cathode terminal of the laser diode is connected, down towards ground or up towards the voltage level at the voltage output of the power supply.

7. The system of claim 6, wherein:
   when the NMOS device is turned on in response to a gate of the NMOS device being pulled up, and the PMOS device is turned off in response to a gate of the PMOS device being pulled down, the output node of the output stage, which is connected to the cathode of the laser diode, is pulled toward ground, which causes current to flow through the laser diode, thereby causing the laser diode to turn on and emit light; and
   when the NMOS device is turned off in response to the gate of the NMOS device being pulled down, and the PMOS device is turned on in response to the gate of the PMOS device being pulled up, the voltage level at the output node of the output stage, which is connected to the cathode of the laser diode, is pulled up towards the voltage level at the voltage output of the power supply, which causes the current to stop flowing through the laser diode, thereby causing the laser diode to turn off and not emit light.

8. The system of claim 1, wherein the laser diode driver includes:
   an active swing controller configured to drive the output stage in a manner that substantially prevents inductive kickback, which occurs in response to the laser diode being turned from on to off, from causing the voltage level at the output node of the output stage swinging past the voltage level at the voltage output of the power supply.

9. The system of claim 8, wherein the laser diode driver also includes:
   a pre-driver that receives a high frequency periodic differential signal that transitions between ground and a high voltage level that is different than the voltage level of the voltage output of the power supply, and voltage shifts the received high frequency periodic differential signal to a high frequency periodic differential signal that transitions between ground and the voltage level of the voltage output of the power supply;
   wherein the high frequency periodic differential signal that transitions between ground and the voltage level of the voltage output of the power supply comprises a modulation signal in dependence on which the active swing controller drives the output stage.

10. The system of claim 8, wherein:
   the first and second transistors of the output stage include an NMOS device and a PMOS device each including a gate, a source, and a drain, wherein the drains of the NMOS and PMOS devices are connected together and to the output node of the output stage; and
   the output stage, under control of the active swing controller,
      selectively pulls the voltage level of the output node of the output stage, and thus the drains of the NMOS and PMOS devices of the output stage, towards ground, in response to which the laser diode is turned on and emits light, and
      selectively pulls the output node of the output stage, and thus the drains of the NMOS and PMOS devices of the output stage, towards the voltage level at the voltage output of the power supply, in response to which the laser diode is turned off and does not emit light.

11. The system of claim 10, wherein the output stage provides:
a discharge path around the laser diode to shunt a current associated with the inductive kickback that occurs in response to the laser diode being turned from on to off; and
impedance matching that substantially eliminates ringing on the cathode terminal of the laser diode, that is connected to the output node of the output stage, while the laser diode is off.

12. A method for use with depth camera system, the method comprising:
producing a voltage output having a voltage level;
selectively turning first and second transistors on and off to selectively pull a voltage level at one of two terminals of a laser diode down toward ground, causing a current to flow from the voltage output through the laser diode, which causes the laser diode to turn on and emit light;
selectively turning the first and second transistors on and off to selectively pull the voltage level at the one of two terminals of the laser diode up to a power supply voltage, causing substantially no current to flow from the voltage output through the laser diode, which causes the laser diode to turn off and not emit light;
detecting light originating from the laser diode that has reflected off an object and is incident of an image pixel detector;
producing depth images in dependence on the light that is incident on the image pixel detector; and
updating an application based on the depth images.

13. The method claim 12, further comprising adjusting the voltage level of the voltage output so that the current that flows through the laser diode when the laser diode is turned on and emitting light is substantially equal to a predetermined desired laser diode current.

14. The method of claim 13, further comprising producing a feedback signal that is used to adjust the voltage level of the voltage output, so that the voltage level of the voltage output comprises a substantially minimum amount of voltage required for the laser diode to emit a predetermined desired light power.

15. The method of claim 14, wherein the producing the feedback signal comprises:
producing a reference drain-to-source voltage indicative of a desired laser diode current;
sampling a drain-to-source voltage of a device of an output stage used to drive the laser diode to thereby produce a drain-to-source voltage sample indicative of an actual current that flows through the laser diode when the laser diode is turned on and emitting light;
sampling the reference drain-to-source voltage to thereby produce a drain-to-source voltage sample that is indicative of the desired laser diode current;
determining a difference between the drain-to-source voltage sample, indicative of the actual current that flows through the laser diode when the laser diode is turned on and emitting light, and the reference drain-to-source voltage indicative of the desired laser diode current; and
outputting a signal indicative of the difference and that is used as the feedback signal while the laser diode is turned on and emitting light.

16. The method of claim 15, wherein:
the signal indicative of the difference is produced using a primary feedback loop and is used as the feedback signal while the laser diode is turned on and emitting light; and
further comprising producing another signal using a secondary feedback loop and used as the feedback signal while the laser diode is turned off and not emitting light, in order to keep the voltage level at the voltage output at at least a specified level while the laser diode is not emitting light.

17. The method of claim 12, further comprising
adjusting the voltage level of the voltage output so that the current that flows through the laser diode when the laser diode is turned on and emitting light is substantially equal to a predetermined desired current.

18. A depth camera system, comprising:
a power supply including a voltage output;
a power supply controller configured to produce a feedback signal that is provided to the power supply and used by the power supply to adjust a voltage level of the voltage output of the power supply;
a laser diode including an anode terminal and a cathode terminal;
a laser diode driver including an output stage, the output stage including first and second transistors, the laser diode driver configured to:
selectively turn the first and second transistors on and off to selectively pull a voltage level at an output node of the output stage down toward ground to cause current to flow from the voltage output of the power supply through the laser diode, which causes the laser diode to turn on and emit light, and
selectively turn the first and second transistors on and off to selectively pull the voltage level at the output node of the output stage up toward a voltage level at the voltage output of the power supply to cause substantially no current to flow from the voltage output of the power supply through the laser diode, which causes the laser diode to turn off and not emit light;
an image pixel detector configured to detect light originating from the laser diode that has reflected off an object and is incident of the image pixel detector; and
one or more processors configured to produce depth images in dependence on outputs of the image pixel detector, and configured to update an application based on the depth images.

19. The system of claim 18, wherein the power supply controller is configured to produce the feedback signal so that the voltage level, at the voltage output of the power supply, is a substantially minimum amount of voltage required for the laser diode to emit a predetermined desired light power.

20. The system of claim 18, wherein the power supply controller comprises:
a reference device that produces a reference drain-to-source voltage indicative of a predetermined desired laser diode current;
a first sampler configured to selectively sample a drain-to-source voltage of a device of the output stage of the laser diode driver to produce a drain-to-source voltage sample indicative of an actual current that flows through the laser diode when the laser diode is turned on and emitting light;
a second sampler configured to selectively sample the drain-to-source voltage of the reference device to produce a drain-to-source voltage sample that is indicative of the desired laser diode current;

a sample controller configured to control the first and second samplers to sample the drain-to-source voltages of the reference device and the device of the output stage while the laser diode is turned on and emitting light; and a differential amplifier configured to determine a difference between the drain-to-source voltage samples produced by the first and second samplers and output a signal indicative of the difference and that is used as the feedback signal while the laser diode is turned on and emitting light;

wherein the signal output by the differential amplifier, which is indicative of the difference between the drain-to-source voltage samples produced by the first and second samplers, is produced using a primary feedback loop of the laser diode driver and is used as the feedback signal while the laser diode is turned on and emitting light; and wherein another signal, which is produced using a secondary feedback loop of the laser diode driver, is used as the feedback signal while the laser diode is turned off and not emitting light.

\* \* \* \* \*